United States Patent
Song et al.

(10) Patent No.: US 9,263,411 B2
(45) Date of Patent: Feb. 16, 2016

(54) SUBMOUNT, ENCAPSULATED SEMICONDUCTOR ELEMENT, AND METHODS OF MANUFACTURING THE SAME

(71) Applicant: Advanced Photonics, Inc., Tokyo (JP)

(72) Inventors: Xueliang Song, Tokyo (JP); Nozomu Sato, Tokyo (JP); Genta Kanno, Kawasaki (JP); Yohko Makino, Tokyo (JP)

(73) Assignee: Advanced Photonics, Inc., Tokyo (JP)

( * ) Notice: Subject to any disclaimer, the term of this patent is extended or adjusted under 35 U.S.C. 154(b) by 0 days.

(21) Appl. No.: 14/406,964

(22) PCT Filed: Jul. 5, 2013

(86) PCT No.: PCT/JP2013/004205
§ 371 (c)(1),
(2) Date: Dec. 10, 2014

(87) PCT Pub. No.: WO2014/010220
PCT Pub. Date: Jan. 16, 2014

(65) Prior Publication Data
US 2015/0108636 A1 Apr. 23, 2015

(30) Foreign Application Priority Data
Jul. 13, 2012 (JP) .................................. 2012-157541

(51) Int. Cl.
*H01L 23/00* (2006.01)
*H01L 23/31* (2006.01)
(Continued)

(52) U.S. Cl.
CPC .............. *H01L 24/17* (2013.01); *H01L 21/561* (2013.01); *H01L 23/13* (2013.01);
(Continued)

(58) Field of Classification Search
CPC ......... H01L 23/12; H01L 21/60; H01L 23/90; H01L 23/31; H01L 25/04; H01L 25/18
USPC ......................................................... 257/737
See application file for complete search history.

(56) References Cited

U.S. PATENT DOCUMENTS

| 5,981,313 | A | 11/1999 | Tanaka |
| 8,198,728 | B2 | 6/2012 | Nishimura |
| 2008/0012117 | A1* | 1/2008 | Kim ...................... H01L 21/561 |
| | | | 257/693 |

FOREIGN PATENT DOCUMENTS

| JP | H07-45649 | 2/1995 |
| JP | H09-051053 | 2/1997 |

(Continued)

OTHER PUBLICATIONS

International Preliminary Report on Patentability and Written Opinion in corresponding application No. PCT/JP2013/004205 dated Jan. 13, 2015.

(Continued)

*Primary Examiner* — Selim Ahmed
(74) *Attorney, Agent, or Firm* — Workman Nydegger

(57) ABSTRACT

The present invention provides a submount which includes a semiconductor element and which can be easily connected to an IC on a main substrate. The submount in one embodiment of the present invention includes: a substrate; electrodes; the semiconductor element; Au wires; and gold bumps. The electrodes, the semiconductor element, the Au wires, and the gold bumps, are encapsulated on the substrate by a resin. The gold bumps are formed on the electrodes and the Au wires by ball bonding and are cut by dicing such that side surfaces of the gold bumps are exposed. The exposed surfaces function as side surface electrodes of the submount.

20 Claims, 58 Drawing Sheets

(51) Int. Cl.
  *H01L 21/56* (2006.01)
  *H01L 25/03* (2006.01)
  *H01L 25/065* (2006.01)
  *H01L 23/13* (2006.01)
  *H01L 23/498* (2006.01)

(52) U.S. Cl.
  CPC ....... *H01L 23/3114* (2013.01); *H01L 23/3135* (2013.01); *H01L 23/49805* (2013.01); *H01L 24/05* (2013.01); *H01L 24/48* (2013.01); *H01L 24/85* (2013.01); *H01L 25/03* (2013.01); *H01L 25/0655* (2013.01); *H01L 25/0657* (2013.01); *H01L 23/3121* (2013.01); *H01L 24/45* (2013.01); *H01L 24/49* (2013.01); *H01L 2224/03334* (2013.01); *H01L 2224/0401* (2013.01); *H01L 2224/04042* (2013.01); *H01L 2224/05644* (2013.01); *H01L 2224/05647* (2013.01); *H01L 2224/05669* (2013.01); *H01L 2224/06155* (2013.01); *H01L 2224/13144* (2013.01); *H01L 2224/16105* (2013.01); *H01L 2224/16108* (2013.01); *H01L 2224/16145* (2013.01); *H01L 2224/16225* (2013.01); *H01L 2224/16227* (2013.01); *H01L 2224/1714* (2013.01); *H01L 2224/45015* (2013.01); *H01L 2224/45124* (2013.01); *H01L 2224/45144* (2013.01); *H01L 2224/45147* (2013.01); *H01L 2224/45169* (2013.01); *H01L 2224/48091* (2013.01); *H01L 2224/48137* (2013.01); *H01L 2224/48157* (2013.01); *H01L 2224/48227* (2013.01); *H01L 2224/48465* (2013.01); *H01L 2224/48471* (2013.01); *H01L 2224/48479* (2013.01); *H01L 2224/48496* (2013.01); *H01L 2224/48639* (2013.01); *H01L 2224/48644* (2013.01); *H01L 2224/48647* (2013.01); *H01L 2224/48655* (2013.01); *H01L 2224/48664* (2013.01); *H01L 2224/48666* (2013.01); *H01L 2224/48669* (2013.01); *H01L 2224/48739* (2013.01); *H01L 2224/48744* (2013.01); *H01L 2224/48747* (2013.01); *H01L 2224/48755* (2013.01); *H01L 2224/48764* (2013.01); *H01L 2224/48766* (2013.01); *H01L 2224/48769* (2013.01); *H01L 2224/48839* (2013.01); *H01L 2224/48844* (2013.01); *H01L 2224/48847* (2013.01); *H01L 2224/48855* (2013.01); *H01L 2224/48864* (2013.01); *H01L 2224/48866* (2013.01); *H01L 2224/48869* (2013.01); *H01L 2224/48997* (2013.01); *H01L 2224/4911* (2013.01); *H01L 2224/49175* (2013.01); *H01L 2224/73207* (2013.01); *H01L 2224/73265* (2013.01); *H01L 2224/81193* (2013.01); *H01L 2224/8592* (2013.01); *H01L 2224/85395* (2013.01); *H01L 2224/85439* (2013.01); *H01L 2224/85444* (2013.01); *H01L 2224/85447* (2013.01); *H01L 2224/85455* (2013.01); *H01L 2224/85464* (2013.01); *H01L 2224/85466* (2013.01); *H01L 2224/94* (2013.01); *H01L 2224/97* (2013.01); *H01L 2225/0651* (2013.01); *H01L 2225/06513* (2013.01); *H01L 2225/06551* (2013.01); *H01L 2225/06562* (2013.01); *H01L 2225/06575* (2013.01); *H01L 2924/01015* (2013.01); *H01L 2924/01047* (2013.01); *H01L 2924/01079* (2013.01); *H01L 2924/12042* (2013.01); *H01L 2924/14* (2013.01); *H01L 2924/157* (2013.01); *H01L 2924/15153* (2013.01); *H01L 2924/15159* (2013.01); *H01L 2924/15787* (2013.01); *H01L 2924/15788* (2013.01); *H01L 2924/3011* (2013.01); *H01L 2924/30107* (2013.01)

(56) References Cited

FOREIGN PATENT DOCUMENTS

| | | |
|---|---|---|
| JP | H09-252027 | 9/1997 |
| JP | H10-107082 | 4/1998 |
| JP | 2003-188312 | 7/2003 |
| JP | 2003-197814 | 7/2003 |
| JP | 2009-54747 | 3/2009 |

OTHER PUBLICATIONS

International Search Report in corresponding Application No. PCT/JP2013/004205 dated Aug. 13, 2013.

* cited by examiner

SUBMOUNT, ENCAPSULATED SEMICONDUCTOR ELEMENT, AND METHODS OF MANUFACTURING THE SAME

TECHNICAL FIELD

The present invention relates to a submount, an encapsulated semiconductor element, and methods for manufacturing the same.

BACKGROUND ART

Conventionally, in some semiconductor modules in which submounts are packaged, electrodes are formed not only on an element mounting surface of the submount but also on a side surface portion of the submount.

Examples of conventional techniques include a module like one shown in FIG. 26. This module 109 includes a main substrate 110, an IC 111 on the main substrate 110, and a submount 100 on the main substrate 110. The submount 100 includes a semiconductor element 104 on an element mounting surface.

In the module shown in FIG. 26, a through-hole electrode and an element mounting electrode are formed as an electrode 102 in the submount 100. An electrical connection between the IC 111 and the semiconductor element 104 is achieved by connecting the IC 111 and the electrode 102 by an AU wire 112.

However, in the module shown in FIG. 26, the electrode 102 is formed over two surfaces of a substrate 101 and an electrode area is large. Accordingly, a parasitic capacitance is large. Furthermore, the module shown in FIG. 26 also includes a through-hole land portion and inevitably has a large pitch, so that there is a problem that a high-density submount cannot be manufactured.

CITATION LIST

Patent Literature

PTL 1: Japanese Patent Laid-Open No. H09-051053 (1997)

SUMMARY OF INVENTION

The present invention has been made in view of the problems described above. An object of the present invention is to provide a high-density submount which has small parasitic capacitance and which does not require formation of a new electrode on a side surface of the submount when electrically connecting an IC and the submount to each other on a substrate.

Moreover, another object of the present invention is to provide an encapsulated semiconductor element which does not require formation of a new electrode on a side surface of the encapsulated semiconductor element when electrically connecting an IC and the encapsulated semiconductor element to each other on a substrate.

The present invention provides a submount characterized in that the submount comprises: a substrate; an electrode on the substrate; a semiconductor element on the substrate; a wire connecting the semiconductor element and the electrode to each other; and one or plurality of bumps on the electrode and the wire, the electrode, the semiconductor element, the wire, and the one or plurality of bumps are encapsulated on the substrate by a resin, the one or plurality of bumps have a cut surface, the cut surface is exposed on a surface of the submount, and the cut surface is an electrode of the submount.

The present invention provides a submount characterized in that the submount comprises: a substrate; an electrode on the substrate; a semiconductor element on the substrate; a wire connecting the semiconductor element and the electrode to each other; and a bump on the electrode and the wire, the bump is encapsulated by a first resin which is locally applied on the substrate, the bump has an exposed cut surface, and the exposed cut surface is an electrode of the submount.

In one embodiment of the present invention, the submount is characterized in that the submount further comprises a second resin encapsulating the electrode, the semiconductor element, the wire, the bump, and the first resin, and the first resin is harder than the second resin. Furthermore, in one embodiment of the present invention, the submount is characterized in that a groove is formed on the substrate and the semiconductor element is mounted in the groove.

One embodiment of the present invention provides a module characterized in that the module comprises: a main substrate; an IC on the main substrate; an electrode on the main substrate; a wire connecting the IC and the electrode to each other; and the submount on the electrode on the main substrate, and the exposed cut surface of the bump of the submount and the electrode on the main substrate are bonded to each other by an electrically-conductive adhesive.

One embodiment of the present invention provides a module characterized in that the module comprises: a main substrate; an IC on the main substrate; and the submount on the main substrate, the main substrate has an upper surface and a lower surface as element mounting surfaces, the IC is mounted on the upper surface and the submount is mounted on the lower surface, and the module further comprises a wire for wire bonding the IC and the submount to each other.

One embodiment of the present invention provides a module characterized in that the module comprises: a main substrate; an IC on the main substrate; a spacer on the IC; and the submount on the spacer, and an electrical connection between the IC and the one or plurality of bumps included in the submount is achieved by one or plurality of bumps placed in a space formed by the spacer.

The present invention provides an encapsulated semiconductor element characterized in that the encapsulated semiconductor element comprises: a semiconductor element; and a bump on the semiconductor element, the bump is encapsulated on the semiconductor element by a resin, the bump has an exposed cut surface, and the exposed cut surface is an electrode of the encapsulated semiconductor element.

The present invention provides an encapsulated semiconductor element characterized in that the encapsulated semiconductor element comprises: a semiconductor element; and a bump on the semiconductor element, the bump is encapsulated by a first resin applied only to a portion around the bump on the semiconductor element, the bump has an exposed cut surface, and the exposed cut surface is an electrode of the encapsulated semiconductor element.

In one embodiment of the present invention, the encapsulated semiconductor element is characterized in that the encapsulated semiconductor element further comprises a second resin encapsulating the semiconductor element, the bump, and the first resin, and the first resin is harder than the second resin.

One embodiment of the present invention provides a module characterized in that the module comprises: a main substrate; an IC on the main substrate; an electrode on the main substrate; a wire connecting the IC and the electrode to each other; and the encapsulated semiconductor element on the electrode on the main substrate, and the exposed cut surface of the bump of the encapsulated semiconductor element and the electrode on the main substrate are bonded to each other by an electrically-conductive adhesive.

One embodiment of the present invention provides a module characterized in that the module comprises: a main substrate; an IC on the main substrate; and the encapsulated semiconductor element on the main substrate, the main substrate has an upper surface and a lower surface as element mounting surfaces, the IC is mounted on the upper surface and the encapsulated semiconductor element is mounted on the lower surface, and the module further comprises: a wire for wire bonding the IC and the encapsulated semiconductor element to each other; and a bump on the wire and the bump included in the encapsulated semiconductor element.

One embodiment of the present invention provides a module characterized in that the module comprises: a main substrate; an IC on the main substrate; a spacer on the main substrate; and the encapsulated semiconductor element on the spacer, an electrical connection between the IC and the bump included in the encapsulated semiconductor element is achieved by one or plurality of bumps placed in a space formed by the spacer.

One embodiment of the present invention provides a module characterized in that the module comprises: a circuit board; and the encapsulated semiconductor element, and the circuit board and the encapsulated semiconductor element are electrically connected to each other by soldering the exposed cut surface of the bump of the encapsulated semiconductor element.

The present invention is characterized in that the invention comprises the steps of: connecting a semiconductor element and an electrode on a substrate by wire bonding using a wire; forming one or plurality of bumps on the electrode and the wire by ball bonding; encapsulating the semiconductor element, the electrode, the wire, and the bump on the substrate by a resin; curing the resin; and dicing the substrate, the electrode, the one or plurality of bumps, and the resin along a dicing line. Furthermore, the present invention is characterized that the invention comprises the step of forming a groove on the substrate and mounting the semiconductor element in the groove.

The present invention is characterized in that the invention comprises the steps of forming a bump on a wafer by ball bonding; encapsulating the bump on the wafer by a resin; curing the resin; and dicing the wafer, the bump, and the resin along a dicing line.

According to the present invention, an IC and a fine element on a substrate can be efficiently electrically connected to each other.

Specifically, in the electrode of the submount in the present invention, the electrode area can be made smaller than that in conventional techniques, and this contributes to reduction of parasitic capacitance.

Moreover, although the conventional submount described above is a two-layer substrate, the submount is a single-layer substrate in the invention of this application. Accordingly, the submount can be manufactured at a lower cost.

Furthermore, in the electrode of the submount in the present invention, a fine pattern for electrode formation can be formed. Since the density of the pattern can be increased, the present invention is suitable for high-density application.

DESCRIPTION OF EMBODIMENTS

Embodiments of the present invention are described below with reference to the drawings.

First Embodiment

Figure 1A:
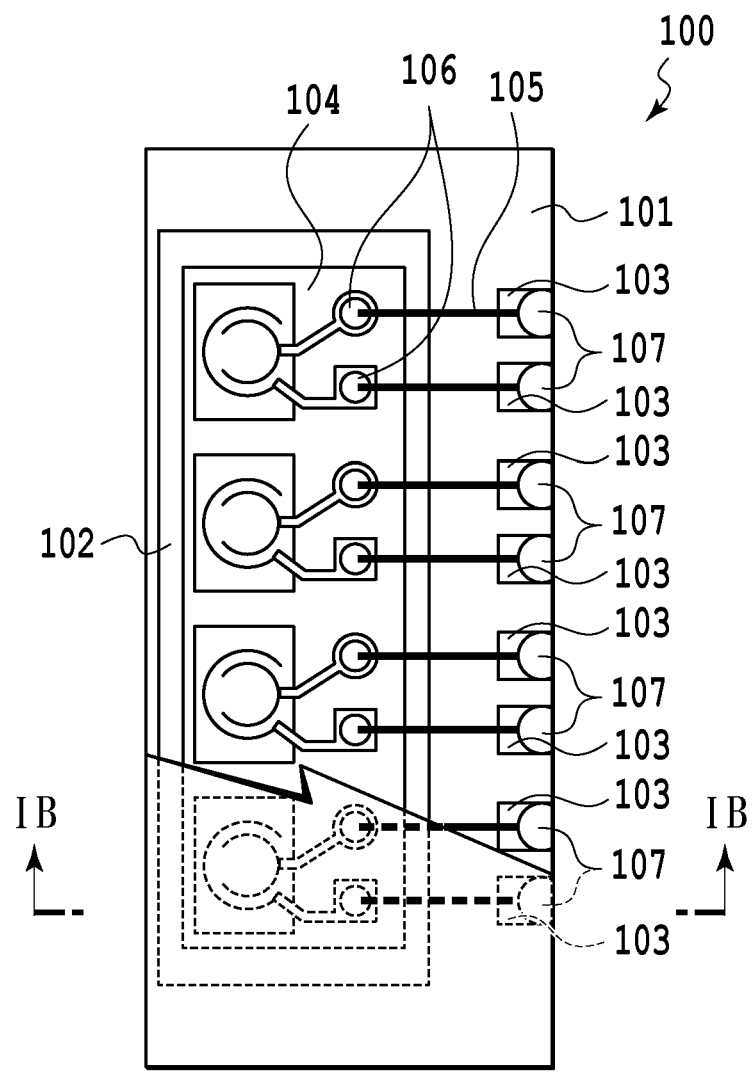
FIG. 1A is a plan view showing a configuration of a submount in a first embodiment of the present invention.
Figure 1B:
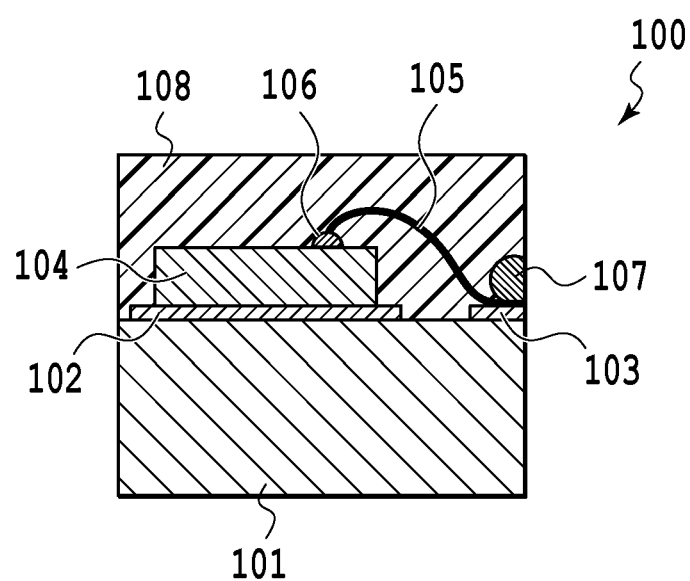
FIG. 1B is a cross-sectional view taken along the cross-section line IB-IB of FIG. 1A.

FIG. 1 includes views showing a configuration of a submount of the embodiment. FIG. 1A is a plan view of the submount. FIG. 1B is a cross-sectional view taken along the cross-section line IB-IB of FIG. 1A. For the sake of description, an upper portion of FIG. 1A is a plan view in which a resin 108 is not illustrated and a lower portion of FIG. 1A is a plan view in which the resin 108 is illustrated. Note that there are other plan views of this application which are illustrated in a similar way.

As shown in FIG. 1, the submount 100 includes a substrate 101, electrodes 102, 103, a semiconductor element 104, Au wires 105, and gold bumps 106, 107. The electrodes 102, 103, the semiconductor element 104, the Au wires 105, and the gold bumps 106, 107 are encapsulated on the substrate 101 by the resin 108.

A rigid substrate such as a glass epoxy substrate, a paper phenol substrate, a paper epoxy substrate, a glass composite substrate, a Teflon (registered trademark) substrate, an alumina substrate, a silicon interposer substrate, or a LTCC substrate as well as a flexible substrate can be used as the substrate 101.

The electrodes are patterned on the substrate. In the embodiment, as shown in FIG. 1, there are patterned the electrode 102 on which the semiconductor element 104 is formed and the multiple electrodes 103 arranged in a straight line on which the gold bumps 107 are formed respectively. Cu can be used as an electrode material. Cu plated by Ni/Au is used as the electrodes. Note that Ag, Au, and the like can be also used as the electrode material. Moreover, Ni/Pd/Au plating, Ni/B plating, Ni/P plating, Ag plating, Pd/Ni plating, Pd plating, Ti/Pd/Au plating, Ti/Pt/Au plating, Ti/Pd/Cu/Ni/Au plating, and the like can be also used as the plating.

As shown in FIG. 1A, circuit patterns such as electrodes are formed on a surface of the semiconductor element. Although the semiconductor element 104 of the embodiment is formed on the electrode 102, it is not necessary to form the semiconductor element on the electrode. The semiconductor element can be formed anywhere on the substrate of the submount.

The semiconductor element 104 and the electrodes 103 are connected by wire bonding using the Au wires 105. Note that types of wire bonding include ball bonding, wedge bonding, and the like, and wires other than the Au wires such as Pt wires, Cu wires, or Al wires can be used as the wires.

Figure 27A:
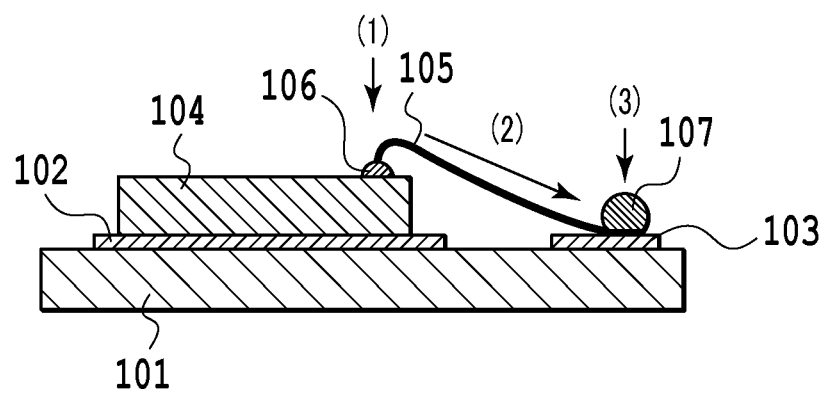
FIG. 27A is a view showing a method of wire bonding in the first embodiment of the present invention.
Figure 27B:
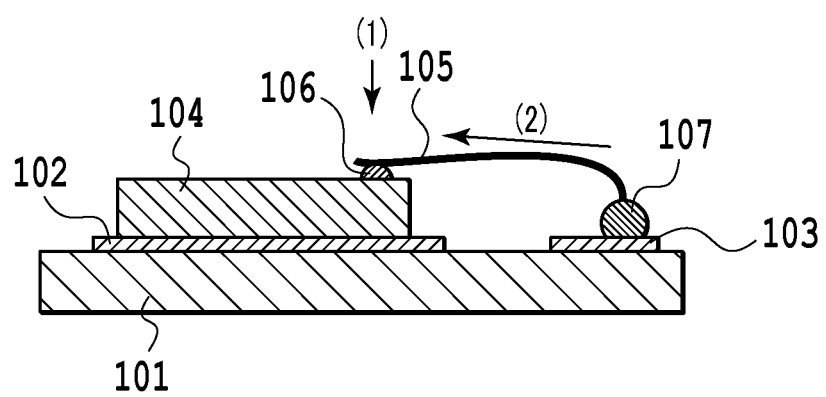
FIG. 27B is a view showing another method of wire bonding in the first embodiment of the present invention.

Examples of a method of wire bonding are shown in FIGS. 27A and 27B. For example, wire bonding can be achieved by performing (1) step of forming the gold bumps 106 of the Au wires 105 on pads of the semiconductor element 104 by a ball bonder (1st bonding), (2) step of connecting the Au wires 105 to the electrodes 103 on the substrate 101 without cutting the Au wires (2nd bonding), and (3) step of forming the gold bumps 107 on the electrodes 103 and the Au wires 105 connected in the 2nd bonding (see FIG. 27A).

In another example, wire bonding can be achieved by performing (1) step of forming the gold bumps 106 of wires on the pads of the semiconductor element 104 and cutting the wires by the ball bonder, (2) step of forming the gold bumps 107 on the electrodes 103 (1st bonding) and connecting the Au wires 105 to the gold bumps 106 without cutting the Au wires (2nd bonding) (see FIG. 27B). In the embodiment, the wire bonding is achieved by using one of these two methods.

The gold bumps 107 are formed on the electrodes 103 and the Au wires 105 by ball bonding. The diameter of each gold bump 107 is 20 µm to 200 µm, preferably 40 µm to 100 µm. As shown in FIG. 1B, the gold bumps 107 have surfaces exposed on a module side surface. These surfaces are exposed due to cut surfaces formed by dicing. A method of manufacturing the submount including dicing and the like is described later. The exposed surfaces of the gold bumps 107 function as side surface electrodes of the submount 100. Note that bumps other than the gold bumps such as platinum (Pt) bumps and copper (Cu) bumps can be used as the bumps.

The resin 108 encapsulates the electrodes 102, 103, the semiconductor element 104, the Au wires 105, and the gold bumps 106, 107 on the substrate 101. A silicone resin, an epoxy resin, an acryl resin, or the like which have a thermosetting property or a UV curing property can be used as the resin 108. The resin 108 is provided to mechanically protect the semiconductor element 104 or to protect the semiconductor element 104 from environments such as moisture and heat. Considering the fact that the wire bonding is often performed together with heat treatment, a resin with sufficient hardness even in heating is preferably used as the resin 108.

Figure 2:
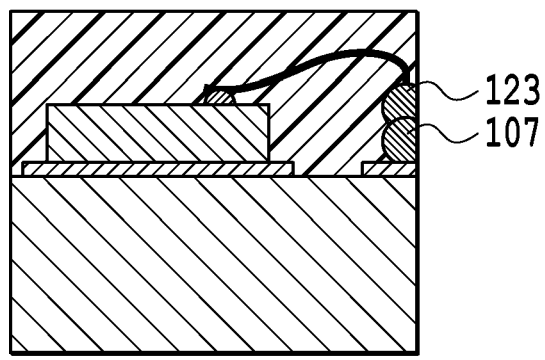
FIG. 2 is a cross-sectional view showing a configuration of a submount in the first embodiment of the present invention.

FIG. 2 is a cross-sectional view showing a configuration of another submount of the embodiment. Although FIG. 1 shows a configuration in which the exposed surface of one gold bump 107 is used as each of the side surface electrodes of the submount, as shown in FIG. 2, exposed surfaces of multiple bumps may be used as each of the side surface electrodes of the submount.

FIGS. 3A to 3D are views showing steps of manufacturing the submount of the embodiment.

Figure 3A:
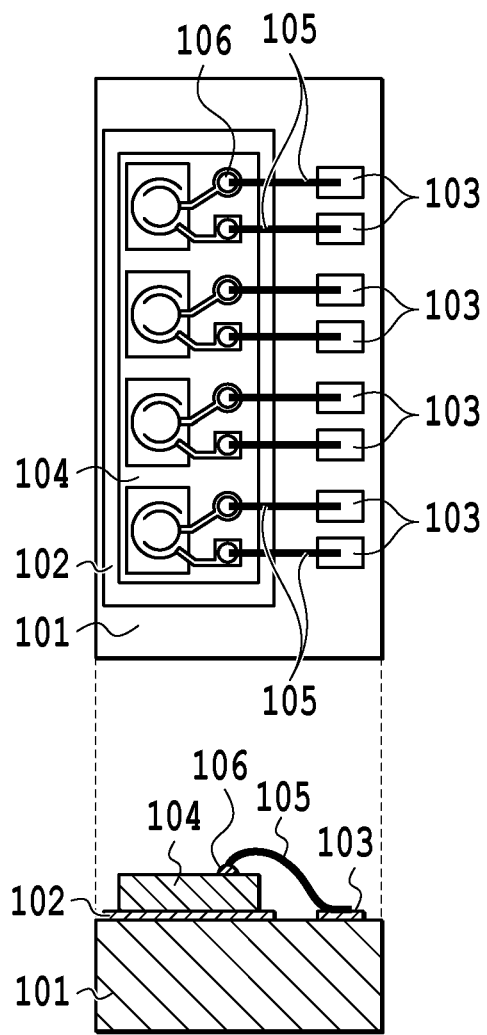
FIG. 3A is a view showing a step of manufacturing the submount in the first embodiment of the present invention.

First, the semiconductor element 104 and the electrodes 103 are connected by wire bonding using the Au wires 105 (FIG. 3A).

Figure 3B:
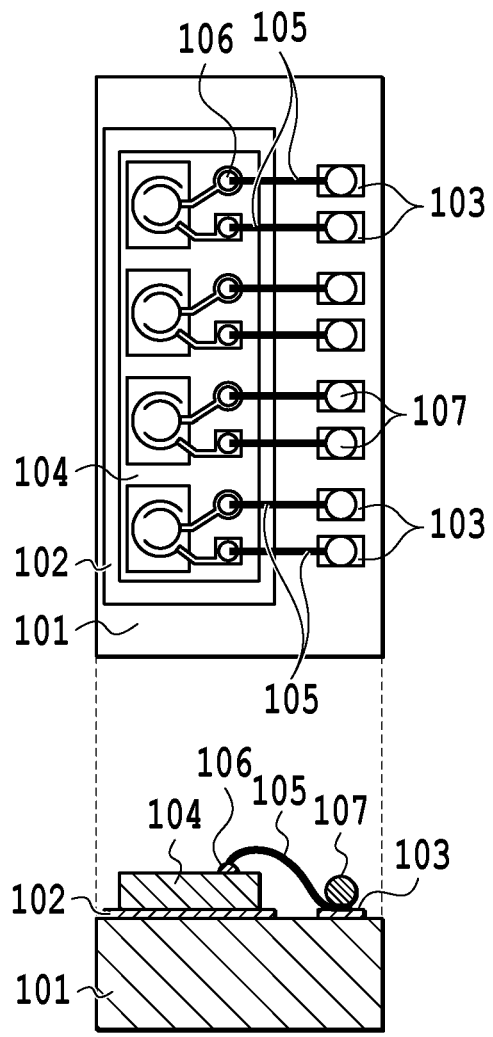
FIG. 3B is a view showing a step of manufacturing the submount in the first embodiment of the present invention.

Next, the gold bumps 107 are formed on the electrodes 103 and the Au wires 105 (FIG. 3B).

Figure 3C:
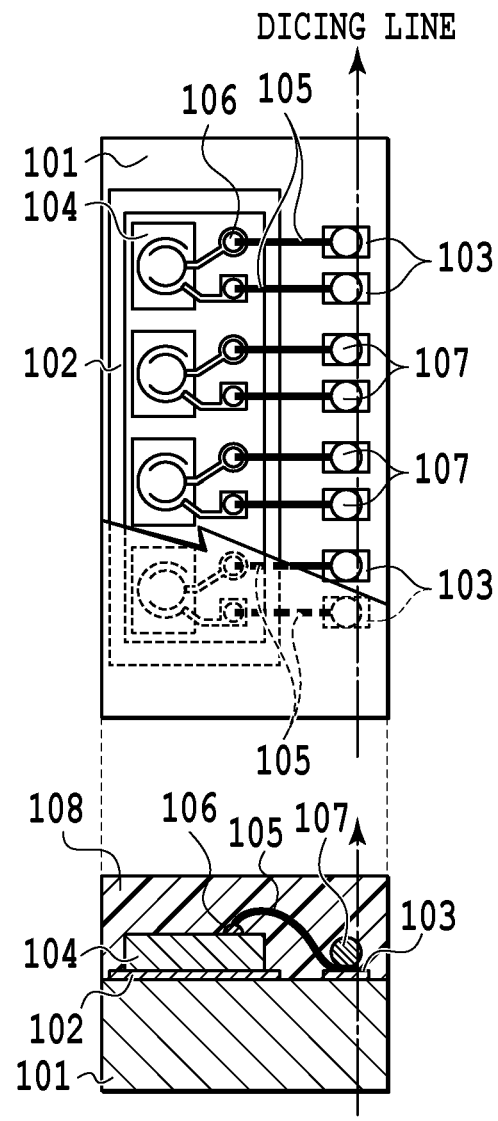
FIG. 3C is a view showing a step of manufacturing the submount in the first embodiment of the present invention.

Then, the resin 108 is applied to encapsulate the electrodes 102, 103, the semiconductor element 104, the Au wires 105, and the gold bumps 106, 107 on the substrate 101. The resin 108 is applied onto the substrate 101 (FIG. 3C). After the application of the resin, the resin is cured by heating, UV curing, or the like.

Figure 3D:
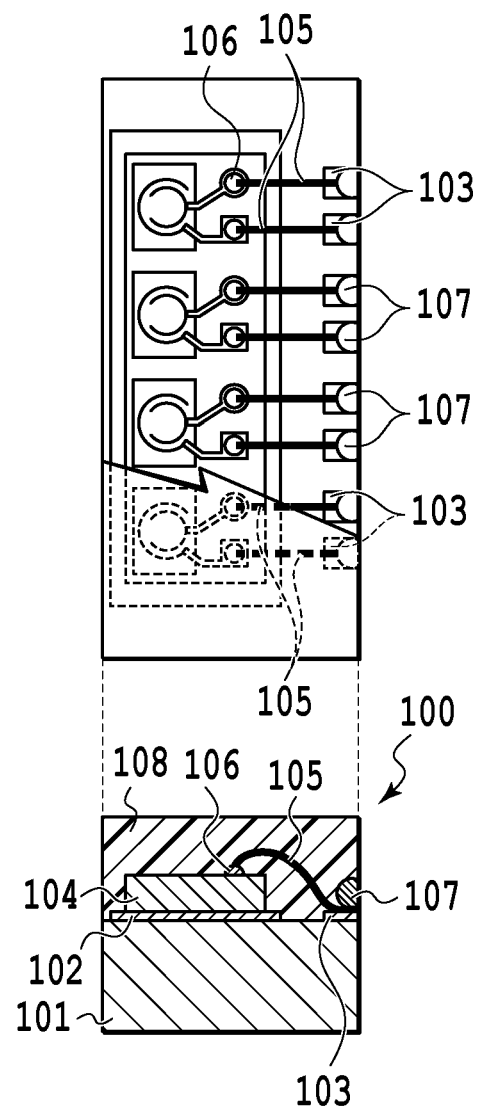
FIG. 3D is a view showing a step of manufacturing the submount in the first embodiment of the present invention.

Lastly, dicing is performed along dicing lines to expose cut surfaces of the gold bumps 107 (FIG. 3D). The exposed surfaces of the gold bumps 107 function as the side surface electrodes of the submount 100.

Figure 4A:
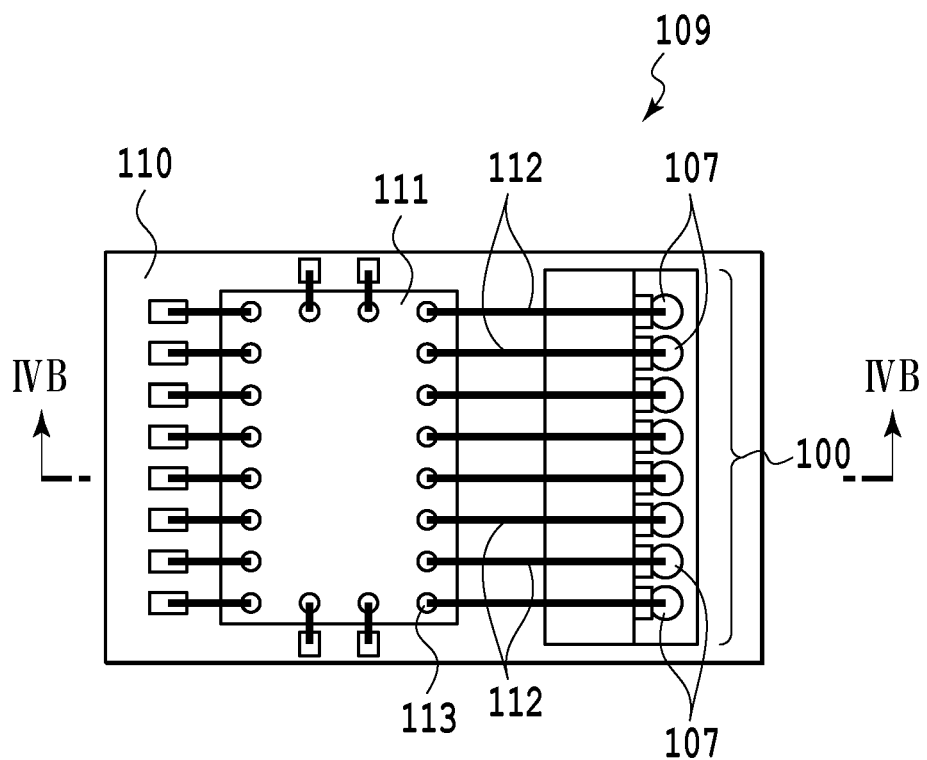
FIG. 4A is a plan view showing a configuration of a module including the submount in the first embodiment of the present invention.
Figure 4B:
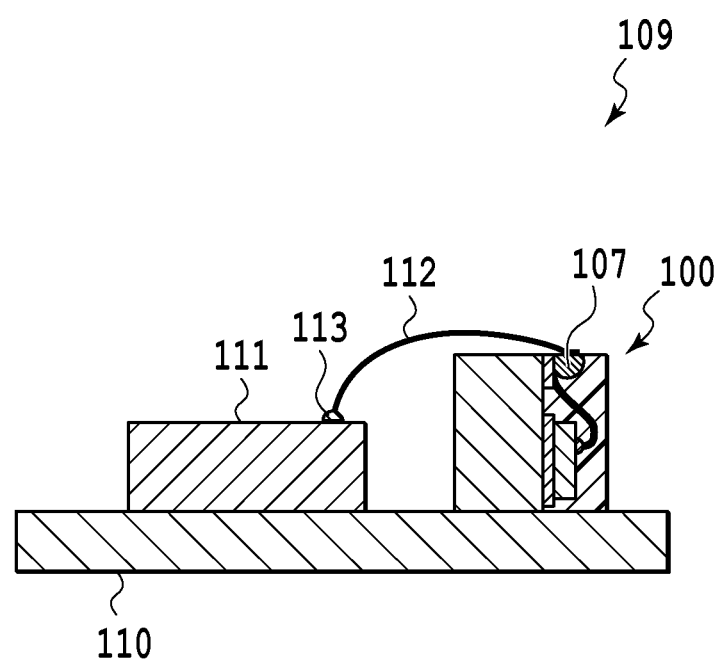
FIG. 4B is a cross-sectional view taken along the cross-section line IVB-IVB of FIG. 4A.

FIG. 4 shows a configuration of a module including the submount of the embodiment. FIG. 4A is a plan view of the module. FIG. 4B is a cross-sectional view taken along the cross-section line IVB-IVB of FIG. 4A.

The module 109 includes a main substrate 110, an IC 111, the submount 100, Au wires 112, and gold bumps 113.

The IC 111 is formed on the main substrate 110.

The submount 100 is formed on the main substrate 110. A side surface of the submount 100 on which no gold bumps 107 are provided is bonded to the main substrate 110 by an adhesive or the like.

The IC 111 and the side surface electrodes (i.e. the exposed cut surfaces of the gold bumps 107) of the submount 100 are connected by wire bonding using the Au wires 112. It is found that the cut surface of the gold bumps 107 exposed by the dicing function as the side surface electrodes of the submount 100.

Figure 5A:
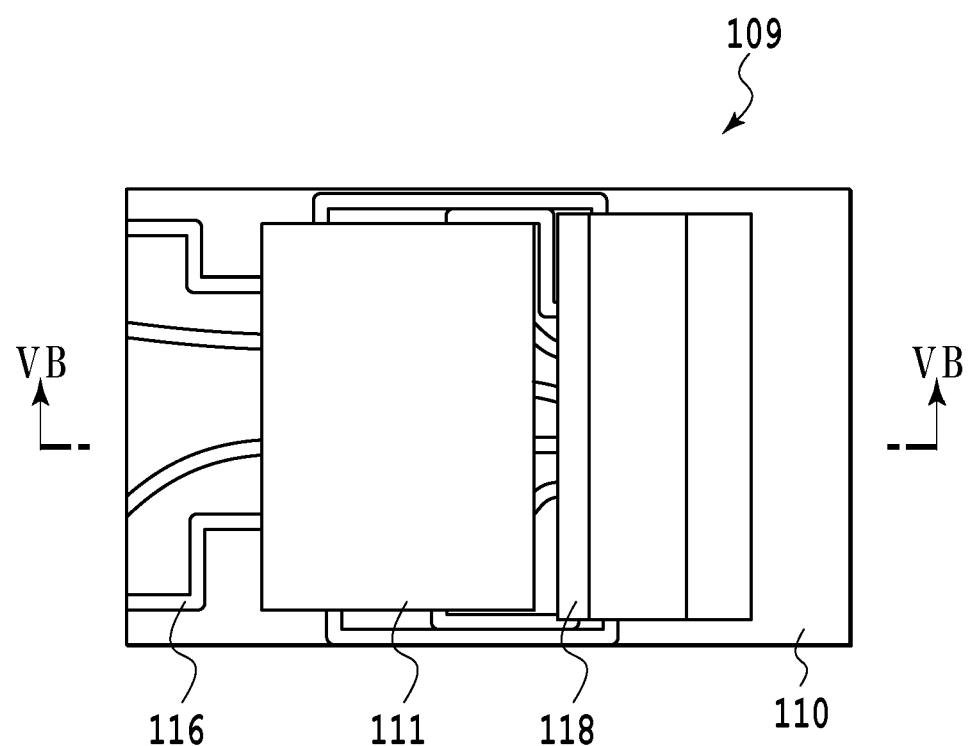
FIG. 5A is a plan view showing a configuration of a module including the submount in the first embodiment of the present invention.
Figure 5B:
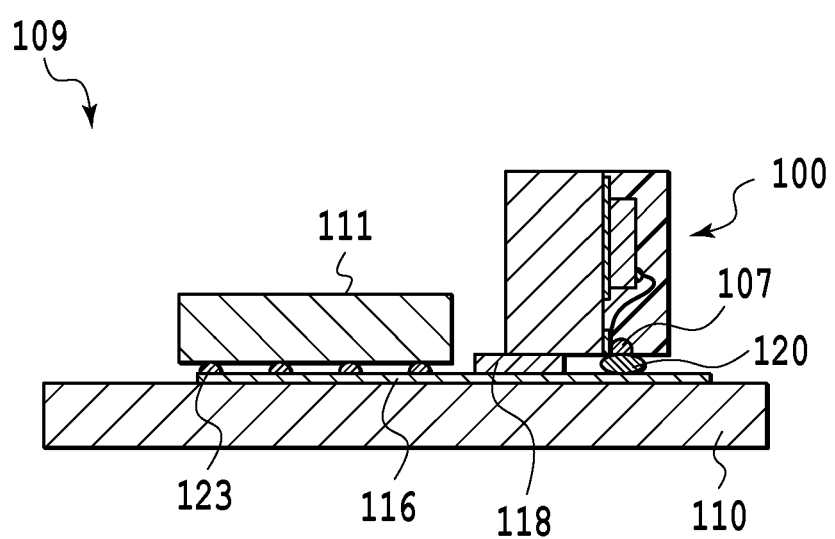
FIG. 5B is a cross-sectional view taken along the cross-section line VB-VB of FIG. 5A.

FIG. 5 shows another configuration of a module including the submount of the embodiment. FIG. 5A is a plan view of the module. FIG. 5B is a cross-sectional view taken along the cross-section line VB-VB of FIG. 5A.

The module 109 includes the main substrate 110, the IC 111, the submount 100, pattern electrodes 116 on the main substrate 110, bumps 123, a spacer 118, and electrical connections 120.

The submount 100 and the IC 111 bonded to the main substrate 110 as in BGA can be electrically connected to each other by the configuration shown in FIG. 5.

The submount 100 is formed on the main substrate 110. A side surface of the submount 100 on which the gold bumps 107 are provided is arranged to face downward and is connected to the electrodes 116 via the electrical connections 120.

The electrical connections 120 between the gold bumps 107 and the electrodes 116 can be achieved by gold bumps or an electrically-conductive adhesive.

Electrical connections between the IC 111 and the electrodes 116 are formed by using the bumps 123 such as solder balls or the like.

Figure 26:
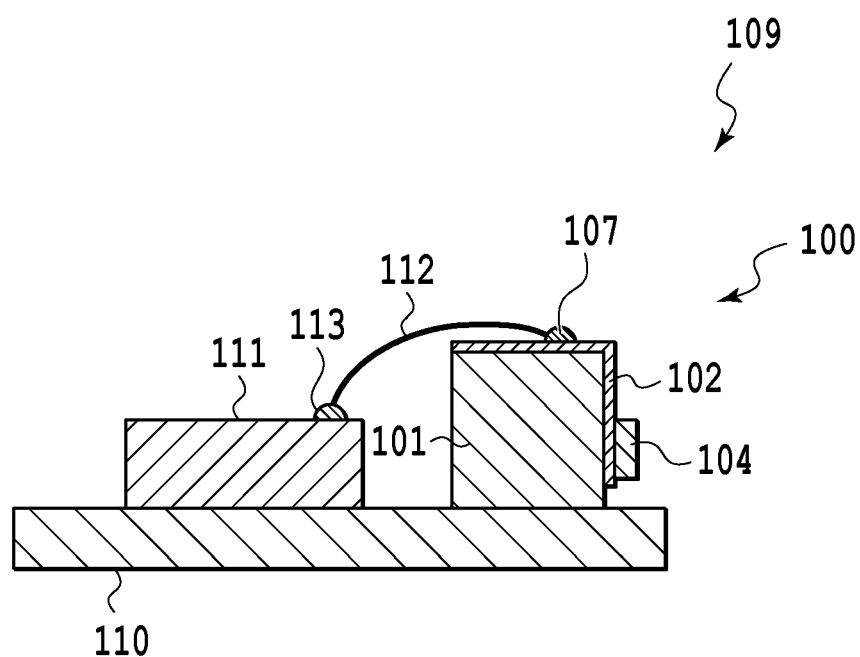
FIG. 26 is a view showing a configuration of a module including a submount of a conventional technique.

In the embodiment, the IC 111 and the submount 100 can be electrically connected to each other without forming electrode patterns on a side surface of the submount as in the conventional technique (see FIG. 26).

Second Embodiment

Figure 6A:
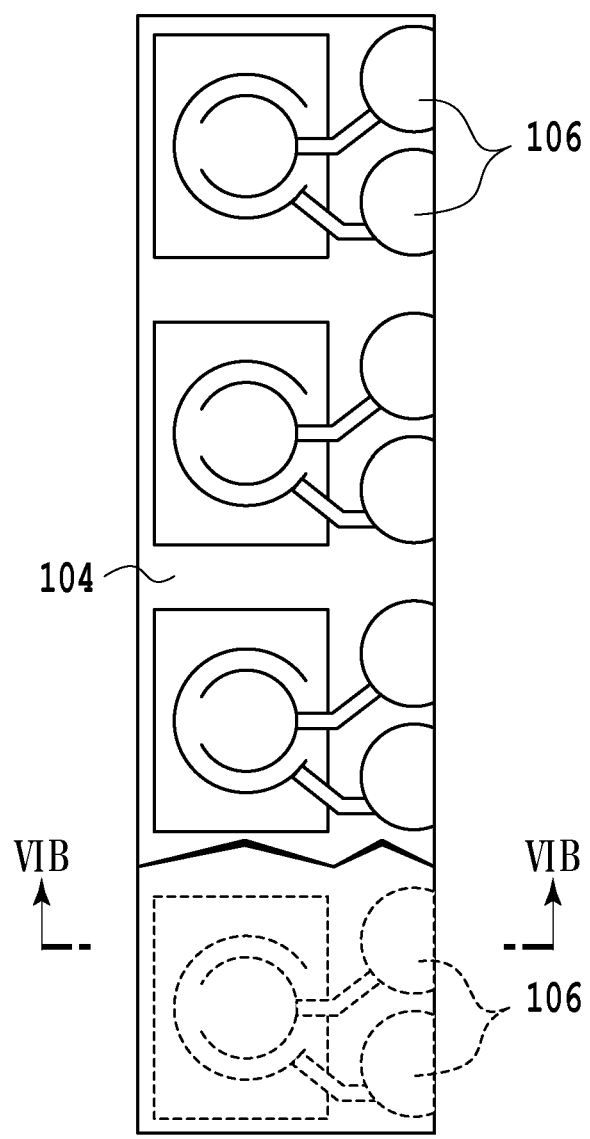
FIG. 6A is a plan view showing a configuration of an encapsulated semiconductor element in a second embodiment of the present invention.
Figure 6B:
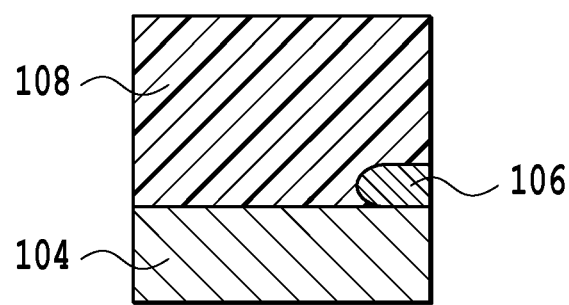
FIG. 6B is a cross-sectional view taken along the cross-section line VIB-VIB of FIG. 6A.

FIG. 6 includes views showing a configuration of a semiconductor element of the embodiment. FIG. 6A is a plan view of the semiconductor element. FIG. 6B is a cross-sectional view taken along the cross-section line VIB-VIB of FIG. 6A.

As shown in FIG. 6, gold bumps 106 are formed on a surface of the semiconductor element 104. The gold bumps 106 are encapsulated by a resin 108 on the semiconductor element 104.

The gold bumps 106 are formed on the semiconductor element 104 by ball bonding. The diameter of each gold bump 106 is preferably about 40 µm to 100 µm. As shown in FIG. 6B, the gold bumps 106 have exposed side surfaces, and these surfaces are exposed due to cut surfaces formed by dicing. A method of manufacturing the encapsulated semiconductor element including dicing and the like is described later. The exposed surfaces of the gold bumps 106 function as side surface electrodes of the encapsulated semiconductor element. Note that bumps other than the gold bumps such as platinum (Pt) bumps and copper (Cu) bumps can be used as the bumps.

A silicone resin, an epoxy resin, an acryl resin, or the like which have a thermosetting property or a UV curing property can be used as the resin 108. The resin 108 is provided to mechanically protect the semiconductor element 104 or to protect the semiconductor element 104 from environments such as moisture and heat. Considering the fact that the wire bonding involves heat treatment, a resin with sufficient hardness even in wire bonding (heating) needs to be used as the resin 108.

Figure 7A:
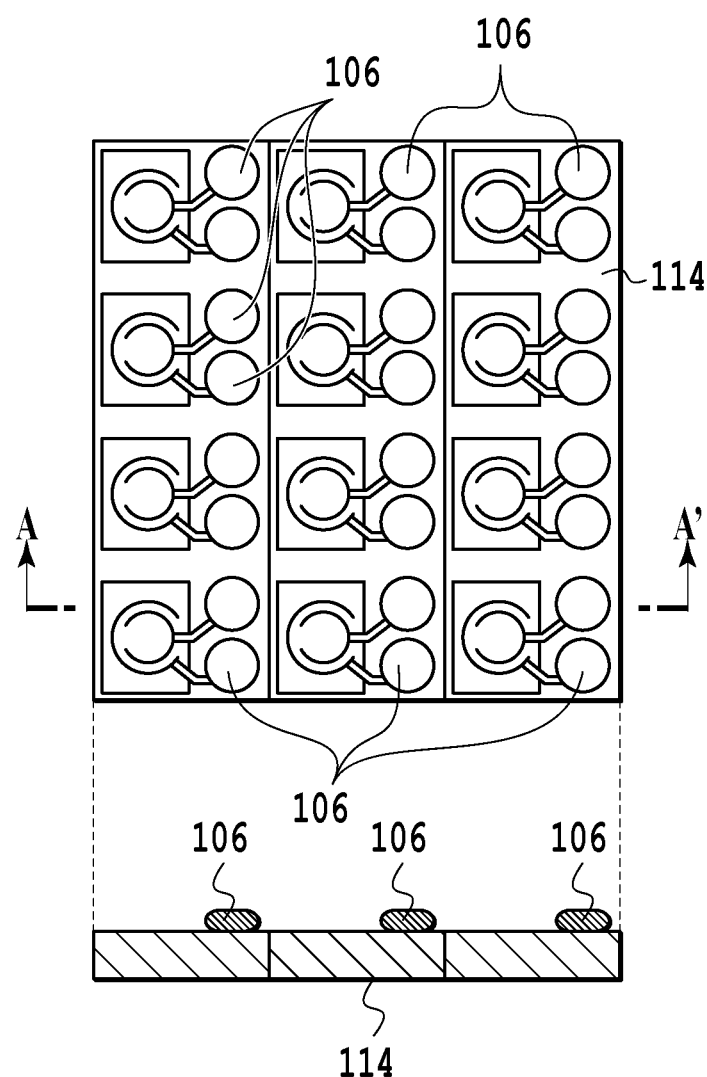
FIG. 7A is a view showing a step of manufacturing the encapsulated semiconductor element in the second embodiment of the present invention.
Figure 7B:
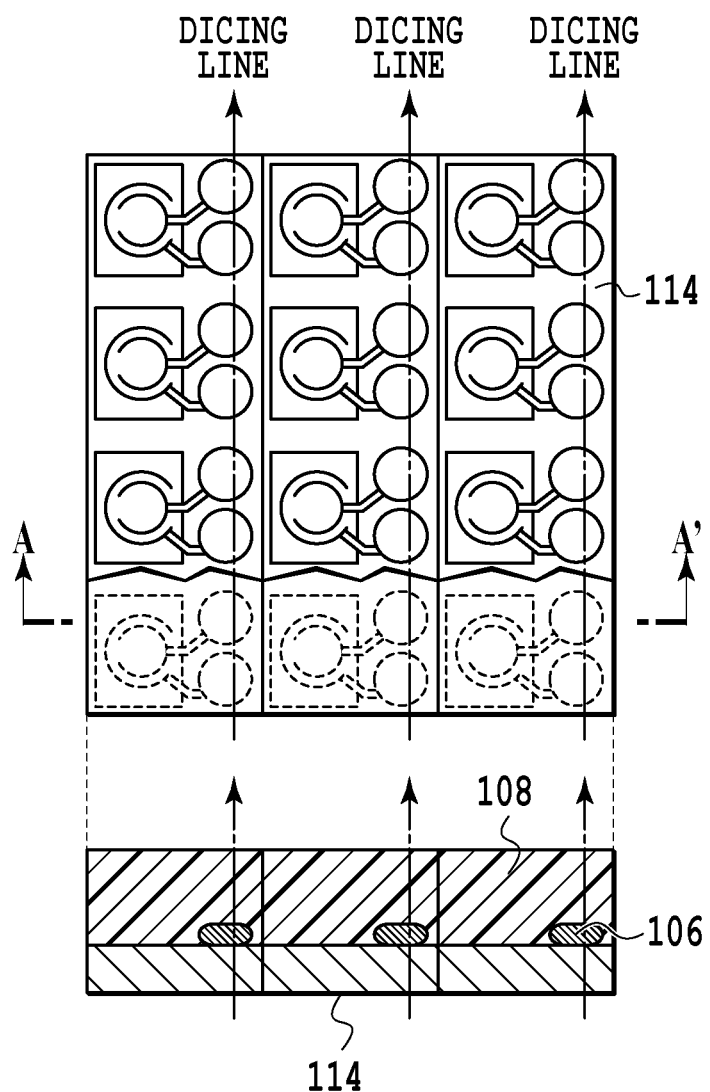
FIG. 7B is a view showing a step of manufacturing the encapsulated semiconductor element in the second embodiment of the present invention.
Figure 7C:
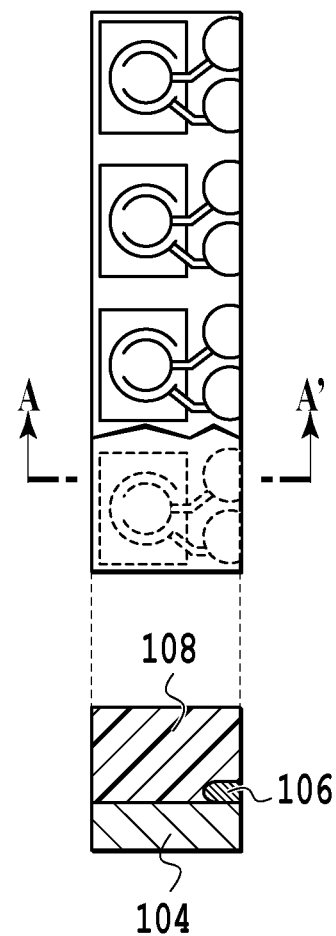
FIG. 7C is a view showing a step of manufacturing the encapsulated semiconductor element in the second embodiment of the present invention.

FIGS. 7A to 7C are views showing steps of manufacturing the encapsulated semiconductor element of the embodiment.

First, the gold bumps 106 are formed on surface electrodes of a wafer 114 not subjected to dicing (FIG. 7A).

Next, the resin 108 is applied to encapsulate the gold bumps 106 on the wafer 114. The resin 108 is evenly applied to the wafer 114 (FIG. 7B). After the application of the resin, the resin is cured by heating, UV curing, or the like.

Lastly, the wafer 114 is diced along dicing lines into individual semiconductor elements 104. Cut surfaces of the gold bumps 106 are exposed by the dicing (FIG. 7C). The exposed surfaces of the gold bumps 106 function as the side surface electrodes of the encapsulated semiconductor element.

Figure 8A:
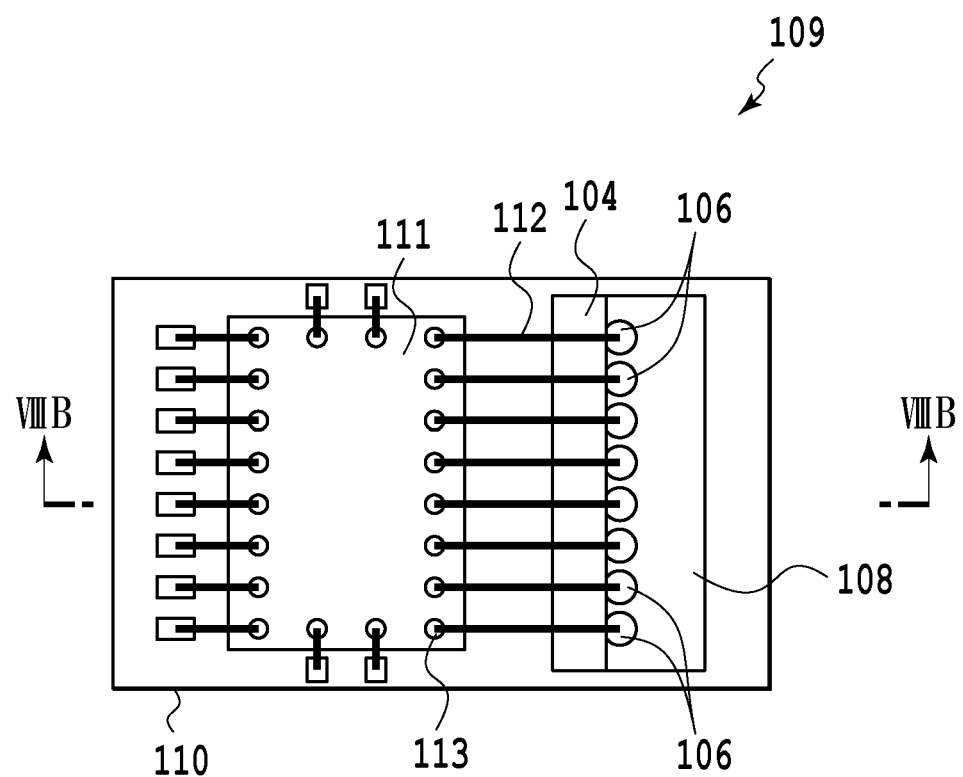
FIG. 8A is a plan view showing a configuration of a module including the encapsulated semiconductor element in the second embodiment of the present invention.
Figure 8B:
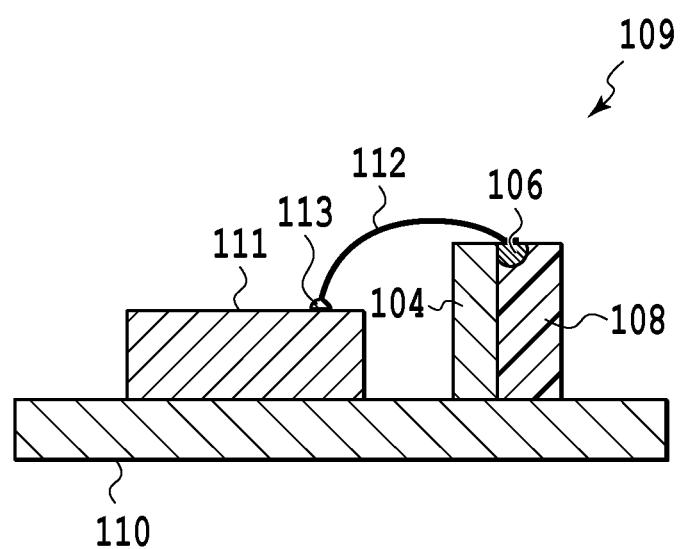
FIG. 8B is a cross-sectional view taken along the cross-section line VIIIB-VIIIB of FIG. 8A.

FIG. 8 shows a configuration of a module including the encapsulated semiconductor element of the embodiment. FIG. 8A is a plan view of the module. FIG. 8B is a cross-sectional view taken along the cross-section line VIIIB-VIIIB of FIG. 8A.

The module 109 includes a main substrate 110, an IC 111, the encapsulated semiconductor element (the semiconductor element 104 including the gold bumps 106 encapsulated by the resin 108), Au wires 112, and gold bumps 113.

The IC 111 is formed on the main substrate 110.

The encapsulated semiconductor element is formed on the main substrate 110. A side surface of the encapsulate semiconductor element on which no gold bumps 106 are provided is bonded to the main substrate 110.

The IC 111 and the side surface electrodes (i.e. the exposed cut surfaces of the gold bumps 106) of the encapsulated semiconductor element are connected by wire bonding using the Au wires 112. It is found that the cut surface of the gold bumps 106 exposed by the dicing function as the side surface electrodes of the encapsulated semiconductor element. Note that types of wire bonding include ball bonding, wedge bonding, and the like, and wires other than the Au wires such as Pt wires, Cu wires, or Al wires can be used as the wires.

In [First Embodiment] and [Second Embodiment] described above, one type of resin is applied onto the substrate or the semiconductor element. However, other variations of encapsulation by resin application exist, and these variations are described in the following embodiments.

Third Embodiment

Figure 9:
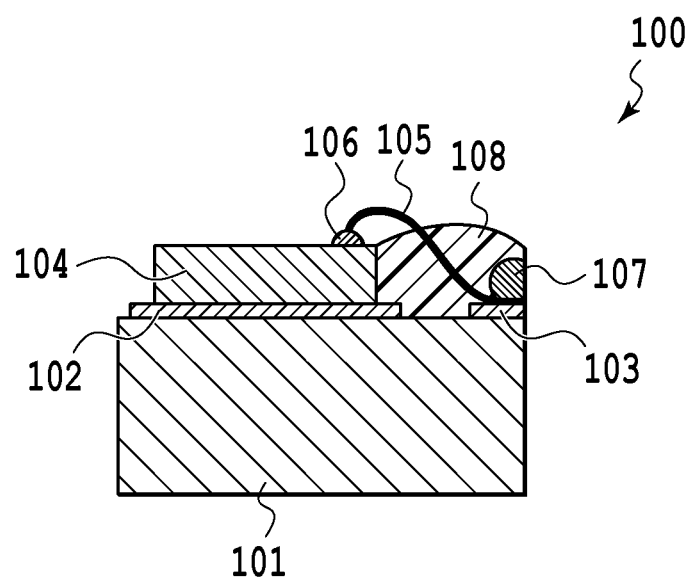
FIG. 9 is a view showing a configuration of a submount in a third embodiment of the present invention.

FIG. 9 is a view showing a configuration of a submount of the embodiment. As shown in FIG. 9, a resin 108 can be applied in such a way that gold bumps 107 are covered. The submount 100 of the embodiment is different from that of [First Embodiment] in that the resin 108 is not applied over an entire substrate 101. Since constitutional elements other than the resin 108 is the same as those of [First Embodiment], description thereof is omitted.

In the embodiment, the semiconductor element 104 is not damaged in the curing of the resin. Moreover, the amount of resin to be applied can be reduced. Note that stress due to resin curing or expansion and shrinkage of the resin caused by temperature fluctuations or the like may damage the semiconductor element.

The submount 100 of the embodiment is manufactured by forming the gold bumps 107 on electrodes 103, applying the resin 108 in such a way that the gold bumps 107 are covered, curing the applied resin 108 by heating, UV curing, or the like, and then performing dicing in such a way that cut surfaces of the gold bumps 107 are exposed. Here, the resin 108 has hardness sufficient to withstand the force of wire bonding.

Fourth Embodiment

Figure 10:
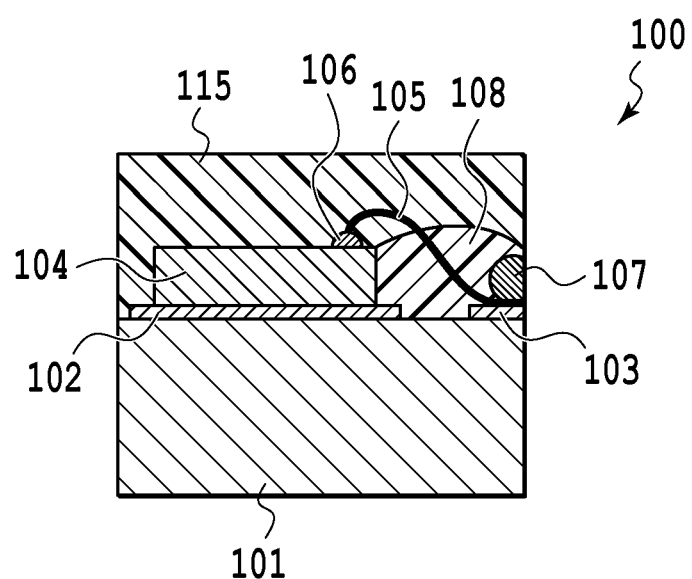
FIG. 10 is a view showing a configuration of a submount in a fourth embodiment of the present invention.

FIG. 10 is a view showing a configuration of a submount of the embodiment. As shown in FIG. 10, it is possible to apply a resin 108 in such a way that gold bumps 107 are covered, and to apply another resin 115 on a substrate 101. The submount 100 of the embodiment is different from that of [Third Embodiment] in that the submount 100 further includes the resin 115. Since constitutional elements other than the resin 115 are the same as those of [Third Embodiment], description thereof is omitted.

The submount 100 of the embodiment is manufactured by forming the gold bumps 107 on electrodes 103, applying the resin 108 in such a way that the gold bumps 107 are covered, applying the resin 115 on the substrate 101, curing the applied resin 115 by heating, UV curing, or the like, and then performing dicing in such a way that cut surfaces of the gold bumps 107 are exposed. Here, the resin 108 has hardness sufficient to withstand force of wire bonding, and the resin 115 has hardness lower than that of the resin 108.

If the hardness of the resin is too high, the semiconductor element 104 may be damaged. However, in the embodiment, since the gold bumps 107 are protected by the hard resin 108 while the semiconductor element 104 is protected by the soft resin 115, the semiconductor element 104 can be prevented from being damaged.

Fifth Embodiment

Figure 11:
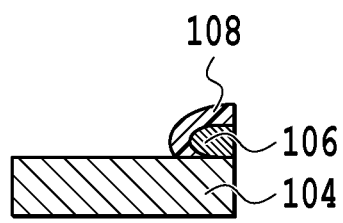
FIG. 11 is a view showing a configuration of an encapsulated semiconductor element in a fifth embodiment of the present invention.

FIG. 11 is a view showing a configuration of an encapsulated semiconductor element of the embodiment. As shown in FIG. 11, a resin 108 can applied only to portions around gold bumps 106 on the semiconductor element 104. Since, the embodiment is the same as [Second Embodiment] other than the configuration that the resin 108 is applied only to the portions around the gold bumps 106, description is omitted.

In the embodiment, the resin 108 is selectively applied. Selectively applying the resin can reduce portions of the semiconductor element covered with the resin. The embodiment is effective in a case where the semiconductor element is negatively affected by the resin covering the semiconductor element.

The encapsulated semiconductor element of the embodiment is manufactured by forming the gold bumps 106 on a wafer, applying the resin 108 on the wafer in such a way that the gold bumps 106 are covered, curing the applied resin 108 by heating, UV curing, or the like, and dicing the wafer into individual semiconductor elements 104 in such a way that cut surfaces of the gold bumps 106 are exposed. Here, the resin 108 has hardness sufficient to withstand force of wire bonding.

Sixth Embodiment

Figure 12:
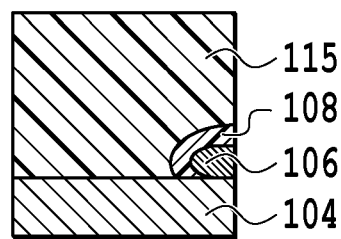
FIG. 12 is a view showing a configuration of an encapsulated semiconductor element in a sixth embodiment of the present invention.

FIG. 12 is a view showing a configuration of an encapsulated semiconductor element of the embodiment. As shown in FIG. 12, it is possible to apply a resin 108 about gold bumps 106 and further apply another resin 115 on the semiconductor element 104. The semiconductor element of the embodiment is different from that of [Fifth Embodiment] in that the semiconductor element further includes the resin 115.

The semiconductor element of the embodiment is manufactured by forming the gold bumps 106 on a wafer, applying the resin 108 on the wafer about the gold bumps 106 in such a way that the gold bumps 106 are covered, applying the resin 115 on the wafer, curing the applied resin 115 by heating, UV curing, or the like, and dicing the wafer into individual semiconductor elements 104 in such a way that cut surfaces of the gold bumps 106 are exposed. Here, the resin 108 has hardness sufficient to withstand the force of wire bonding, and the resin 115 has hardness lower than that of the resin 108.

If the hardness of the resin covering the semiconductor element 104 is too high, the semiconductor element 104 may be damaged. However, in the embodiment, since the gold bumps 106 are protected by the hard resin 108 while the semiconductor element 104 is protected by the soft resin 115, the semiconductor element 104 can be prevented from being damaged. Note that stress due to resin curing or expansion and shrinkage of the resin caused by temperature fluctuations or the like may damage the semiconductor element.

Seventh Embodiment

Description is given below of a variation of a module on which the submount of [Fourth Embodiment] described above is mounted.

Figure 13A:
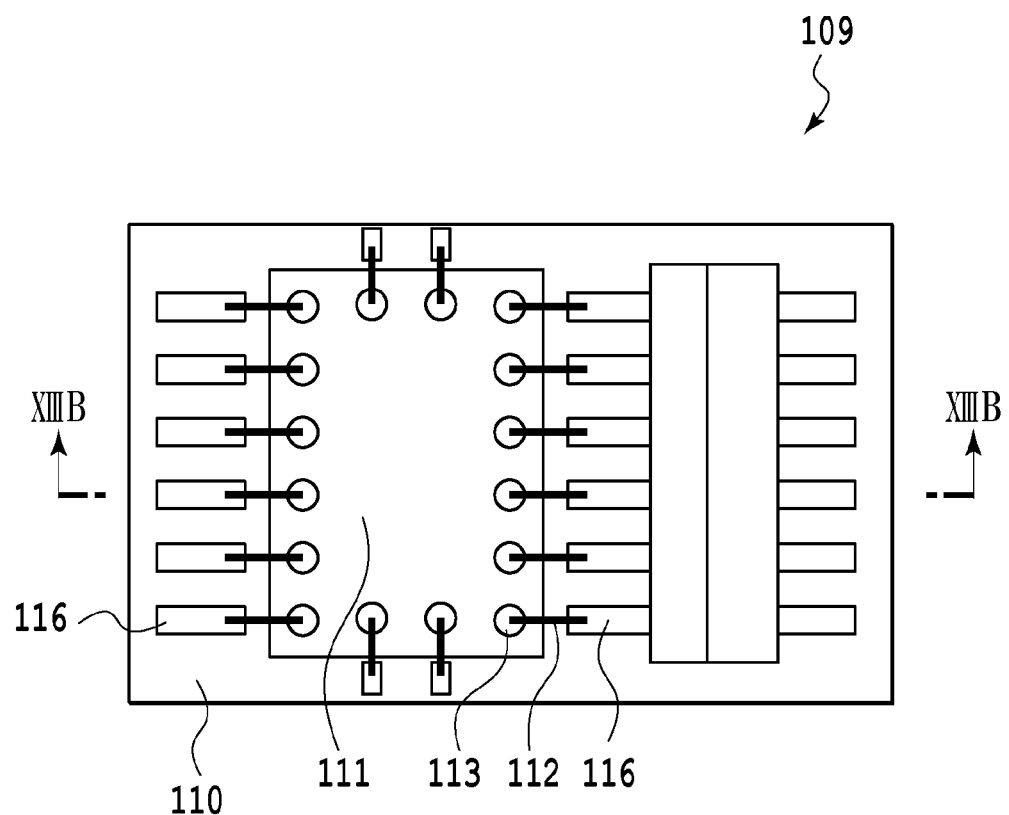
FIG. 13A is a plan view showing a configuration of a module in a seventh embodiment of the present invention.
Figure 13B:
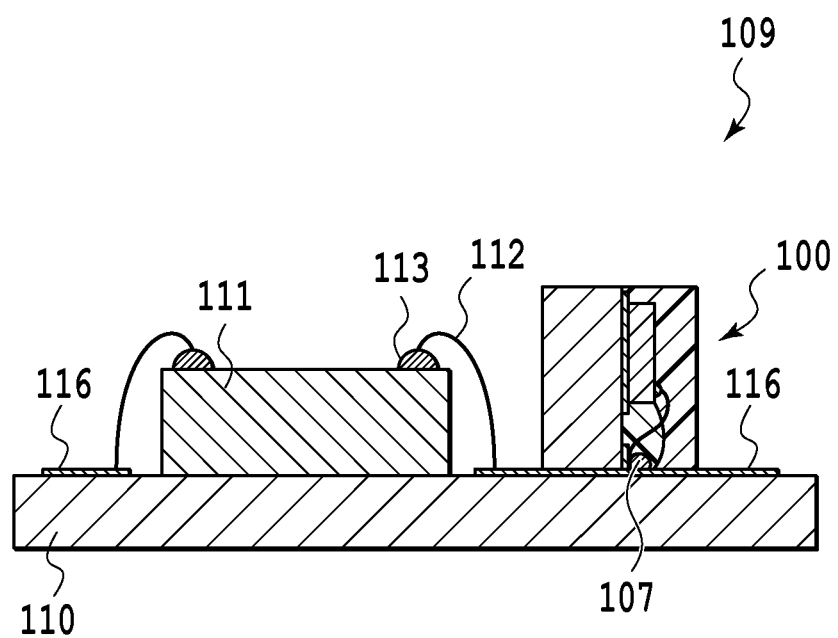
FIG. 13B is a cross-sectional view taken along the cross-section line XIIIB-XIIIB of FIG. 13A.

FIG. 13A is a plan view showing a configuration of the module of the embodiment, and FIG. 13B is a cross-sectional view taken along the cross-section line XIIIB-XIIIB of FIG. 13A. As shown in FIGS. 13A and 13B, the module 109 of the embodiment includes a main substrate 110, electrodes 116 on the main substrate 110, an IC 111 on the main substrate 110, a submount 100 on the main substrate 110, Au wires 112 connecting the IC 111 and the submount 100, and gold bumps 113 on the IC 111.

The submount 100 is mounted on the electrodes 116. In this case, gold bumps 107 of the submount 100 and the electrodes 116 are bonded to one another with an electrically-conductive adhesive and are thus electrically connected to one another. In the structure shown in FIG. 13, electrical connections are achieved by bonding the gold bumps 107 and the electrodes 116 to one another with the electrically-conductive adhesive.

Figure 14:
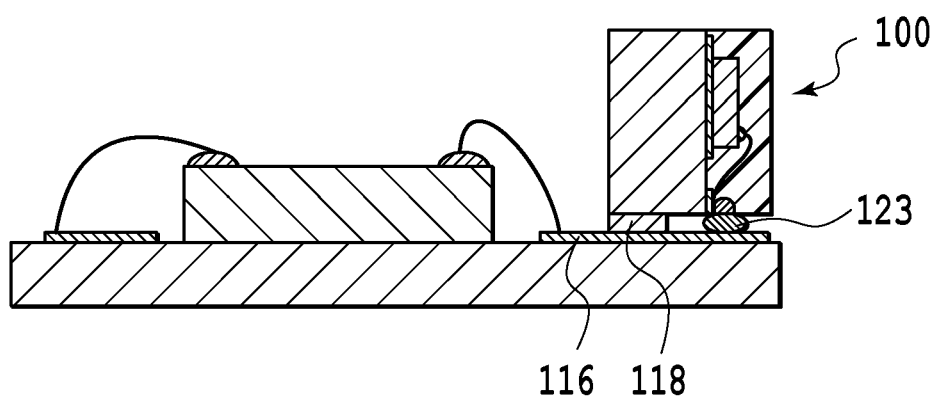
FIG. 14 is a cross-sectional view showing a configuration of another module in the seventh embodiment of the present invention.

FIG. 14 is a cross-sectional view showing a configuration of another module of the embodiment. As shown in FIG. 14, electrical connections may be achieved by inserting a spacer 118 between the submount 100 and the electrodes 116 and providing bumps 123 in a space formed by the spacer 118.

Eighth Embodiment

Figure 15A:
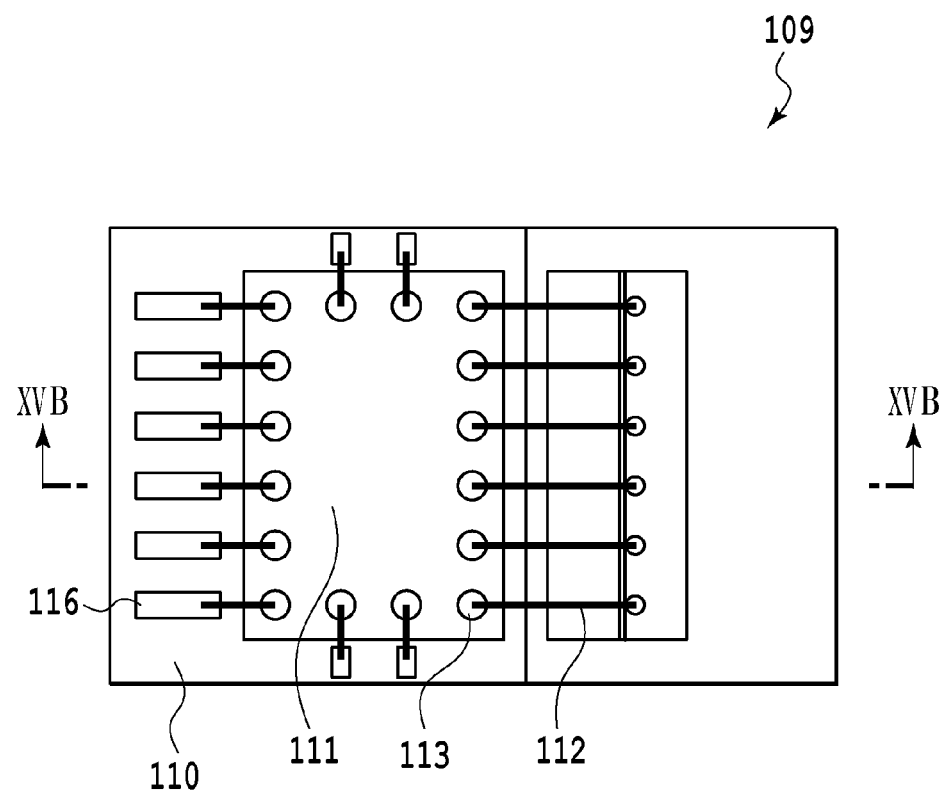
FIG. 15A is a plan view showing a configuration of a module in an eighth embodiment of the present invention.
Figure 15B:
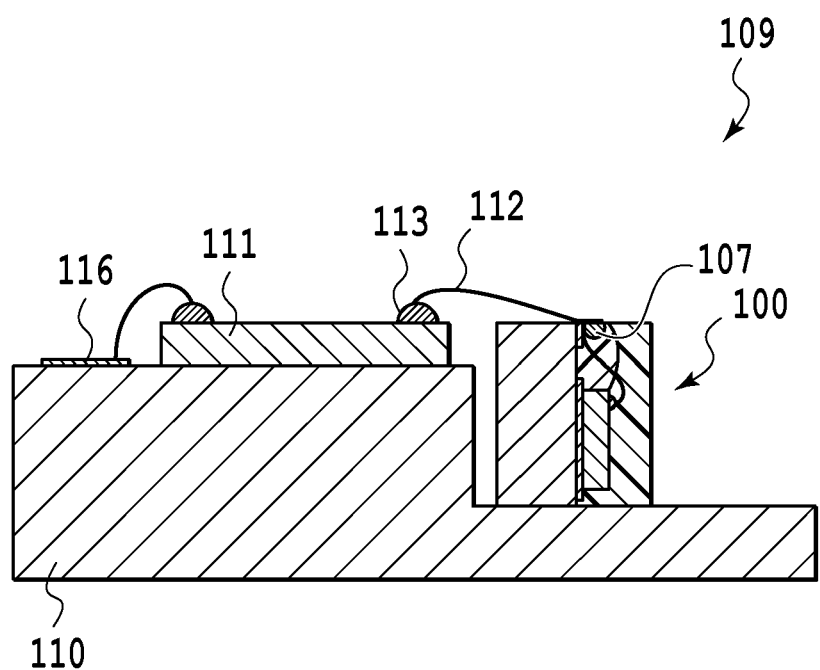
FIG. 15B is a cross-sectional view taken along the cross-section line XVB-XVB of FIG. 15A.

FIG. 15A is a plan view showing a configuration of a module of the embodiment, and FIG. 15B is a cross-sectional view taken along the cross-section line XVB-XVB of FIG. 15A. As shown in FIGS. 15A and 15B, the module 109 of the embodiment includes a main substrate 110, electrodes 116 on the main substrate 110, an IC 111 on the main substrate 110, a submount 100 on the main substrate 110, Au wires 112 connecting the IC 111 and the submount 100, and gold bumps 113 on the IC 111.

As shown in FIG. 15B, a step is formed in the main substrate 110 by spot-facing, and an element mounting surface of the main substrate 110 has an upper surface and a lower surface. The IC 111 is mounted on the upper surface of the main substrate 110, and the submount 100 is mounted on the lower surface of the main substrate 110.

The gold bumps 113 are provided on an IC substrate to connect the IC 111 and the submount 100 by using the Au wires 112.

In the embodiment, wiring of the Au wires 112 between the gold bumps 113 and the gold bumps 107 is short, and the inductance can be suppressed. Accordingly, it is possible to achieve high-speed lines in the module of the embodiment.

Ninth Embodiment

Figure 16A:
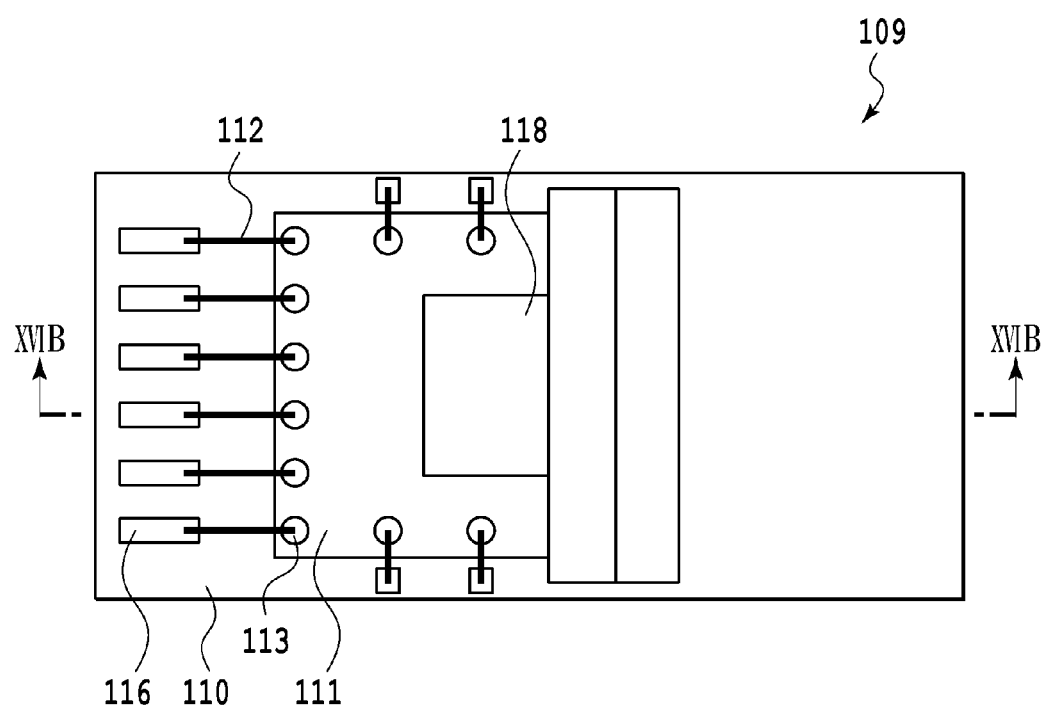
FIG. 16A is a plan view showing a configuration of a module in a ninth embodiment of the present invention.
Figure 16B:
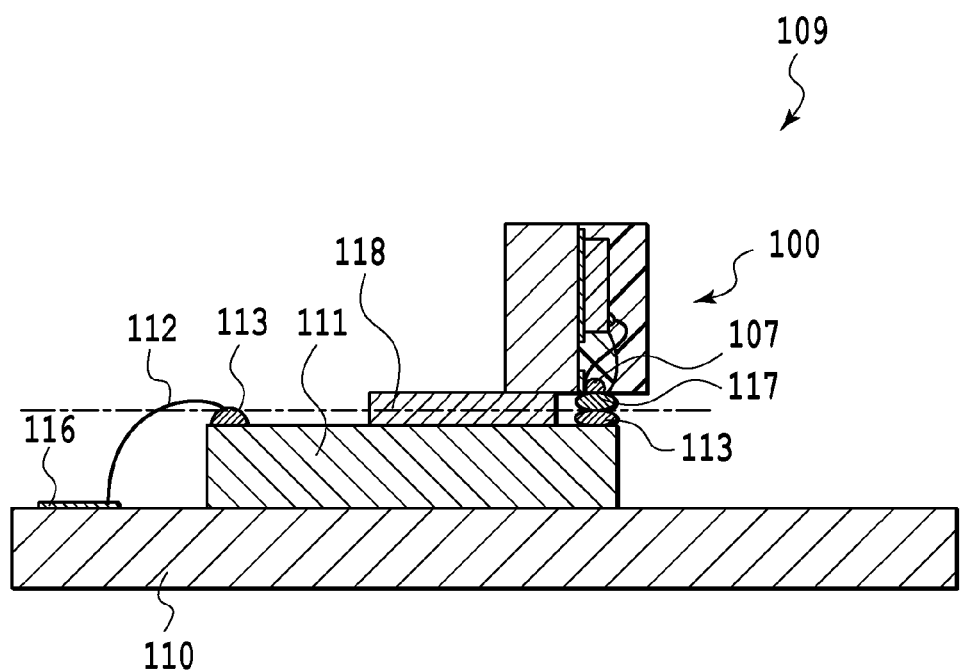
FIG. 16B is a cross-sectional view taken along the cross-section line XVIB-XVIB of FIG. 16A.

FIG. 16A is a plan view showing a configuration of a module of the embodiment, and FIG. 16B is a cross-sectional view taken along the cross-section line XVIB-XVIB of FIG. 16A. As shown in FIGS. 16A and 16B, the module 109 of the embodiment includes a main substrate 110, electrodes 116 on the main substrate 110, an IC 111 on the main substrate 110, a spacer 118 on the IC 111, a submount 100 on the spacer 118, and gold bumps 113, 117. The gold bumps 117 are in contact with exposed cut surfaces of gold bumps 107 included in the submount 100.

The spacer 118 is installed between the IC 111 and the submount 100. The gold bumps 113 on the IC 111 and the gold bumps 117 come into contact with one another in a space formed by the spacer 118. The IC 111 and the submount 100 can be electrically connected to each other by this configuration.

In the embodiment, although each of the electrical connections between the IC 111 and the submount 100 is achieved by placing two gold bumps in a space formed by the spacer, the number of gold bumps placed in the space formed by the spacer to achieve the electrical connection may be any number of one or more. The spacer is provided in such a way that the submount 100 and Au wires 112 subjected to wiring and extending out from pads do not come into contact with each other, and electrical connection is achieved by using any number of gold bumps provided in the space formed by the spacer.

Tenth Embodiment

Description is given below of a variation of a module on which the encapsulated semiconductor element of [Sixth Embodiment] described above is mounted.

Figure 17A:
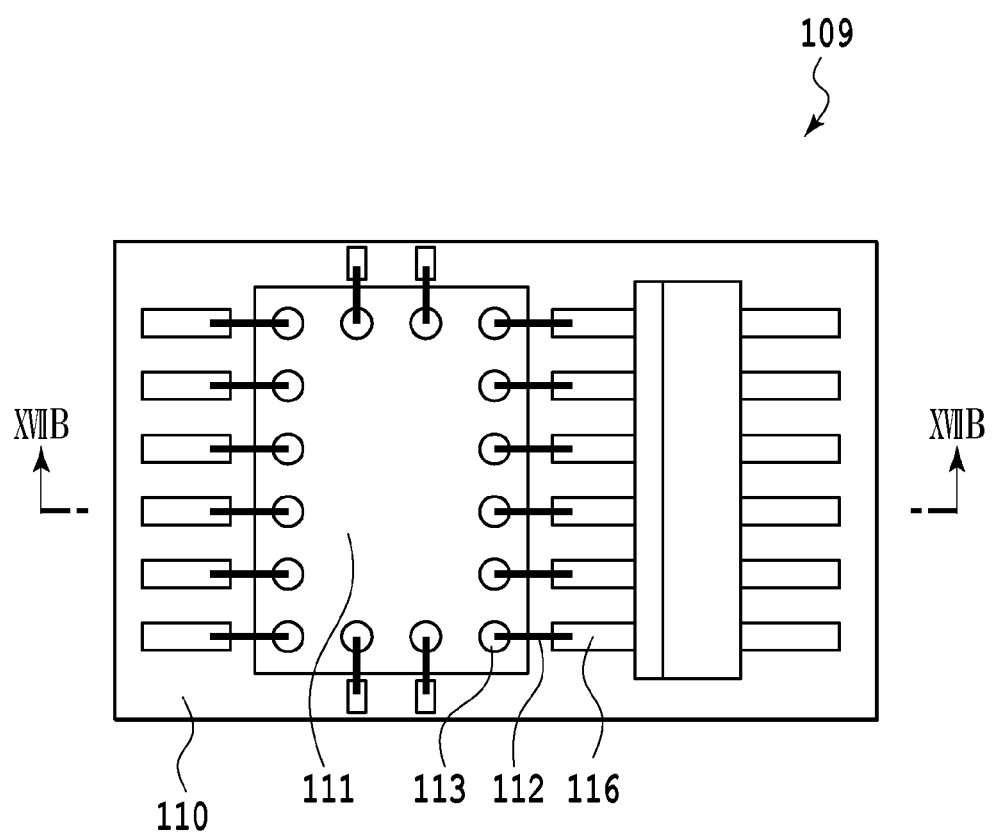
FIG. 17A is a plan view showing a configuration of a module in a tenth embodiment of the present invention.
Figure 17B:
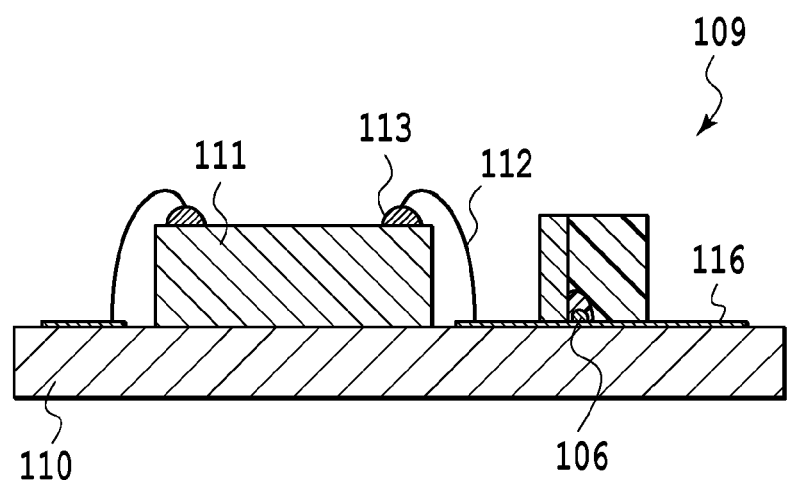
FIG. 17B is a cross-sectional view taken along the cross-section line XVIIB-XVIIB of FIG. 17A.

FIG. 17A is a plan view showing a configuration of the module of the embodiment, and FIG. 17B is a cross-sectional view taken along the cross-section line XVIIB-XVIIB of FIG. 17A. As shown in FIGS. 17A and 17B, the module 109 of the embodiment includes a main substrate 110, electrodes 116 on the main substrate 110, an IC 111 on the main substrate 110, the encapsulated semiconductor element on the main substrate 110, Au wires 112 connecting the IC 111 and the encapsulated semiconductor elements to each other, and gold bumps 113 on the IC 111.

The encapsulated semiconductor element is mounted on the electrodes 116. In this case, the electrodes 116 and gold bumps 106 of the encapsulated semiconductor element are bonded to one another by an electrically-conductive adhesive and are thus electrically connected to one another.

In the structure shown in FIG. 17, the electrical connection is achieved by bonding the gold bumps 106 and the electrodes 116 to one another with the electrically-conductive adhesive. However, the electrical connection may be achieved by inserting a spacer between the encapsulated semiconductor and the electrodes 116 and providing bumps in a space formed by the spacer 118.

Eleventh Embodiment

Figure 18A:
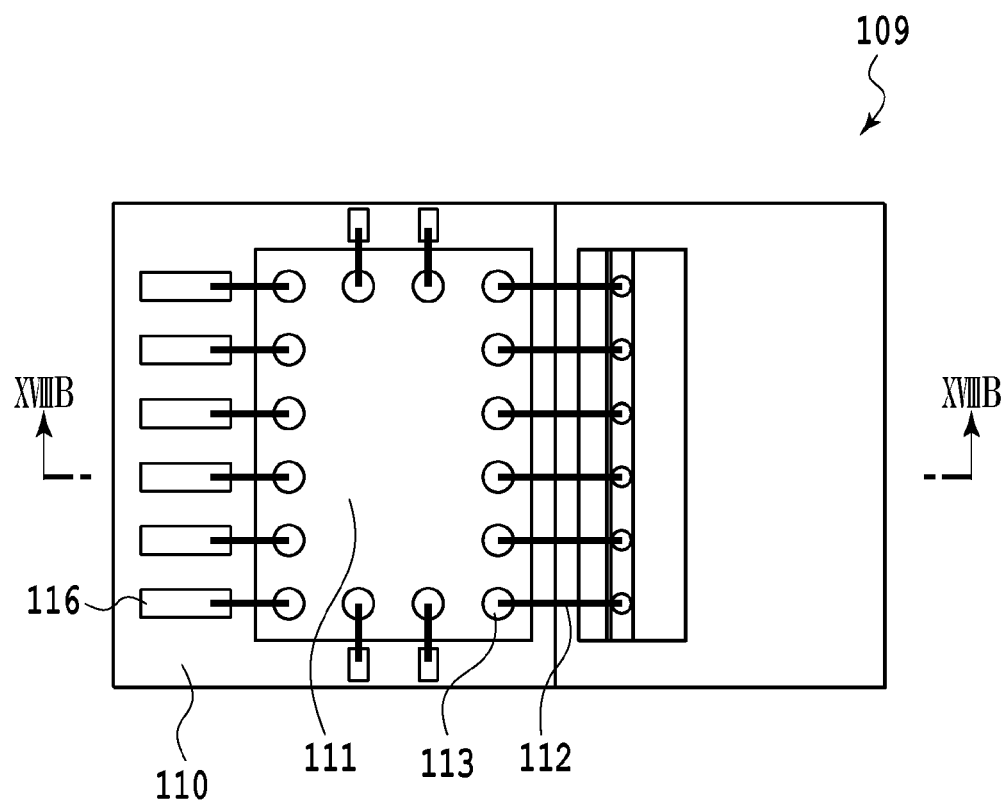
FIG. 18A is a plan view showing a configuration of a module in an eleventh embodiment of the present invention.
Figure 18B:
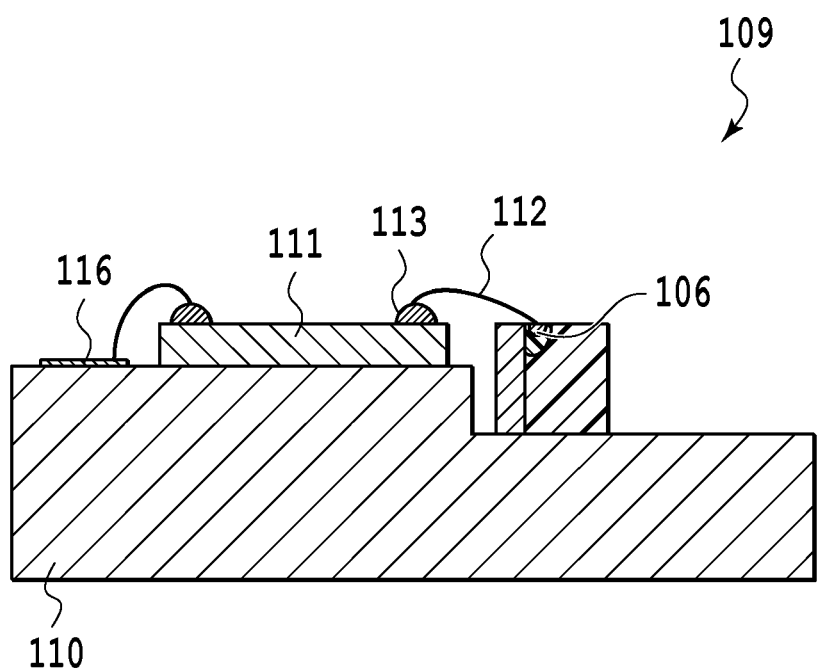
FIG. 18B is a cross-sectional view taken along the cross-section line XVIIIB-XVIIIB of FIG. 18A.

FIG. 18A is a plan view showing a configuration of a module of the embodiment, and FIG. 18B is a cross-sectional view taken along the cross-section line XVIIIB-XVIIIB of FIG. 18A. As shown in FIGS. 18A and 18B, the module 109 of the embodiment includes a main substrate 110, electrodes 116 on the main substrate 110, an IC 111 on the main substrate 110, an encapsulated semiconductor element on the main substrate 110, Au wires 112 connecting the IC 111 and the encapsulated semiconductor element to each other, and gold bumps 113 on the IC 111.

A step is formed in the main substrate 110 by spot-facing, and an element mounting surface of the main substrate 110 has an upper surface and a lower surface. The IC 111 is mounted on the upper surface of the main substrate 110, and the encapsulated semiconductor element is mounted on the lower surface of the main substrate 110.

The gold bumps 113 are provided on the IC 111 to connect the IC 111 and the encapsulated semiconductor element to each other by using the Au wires 112. Since exposed cut surfaces of the gold bumps 106 function as side surface electrodes of the encapsulated semiconductor element, the IC 111 and the encapsulated semiconductor element can be electrically connected to each other.

Twelfth Embodiment

Figure 19A:
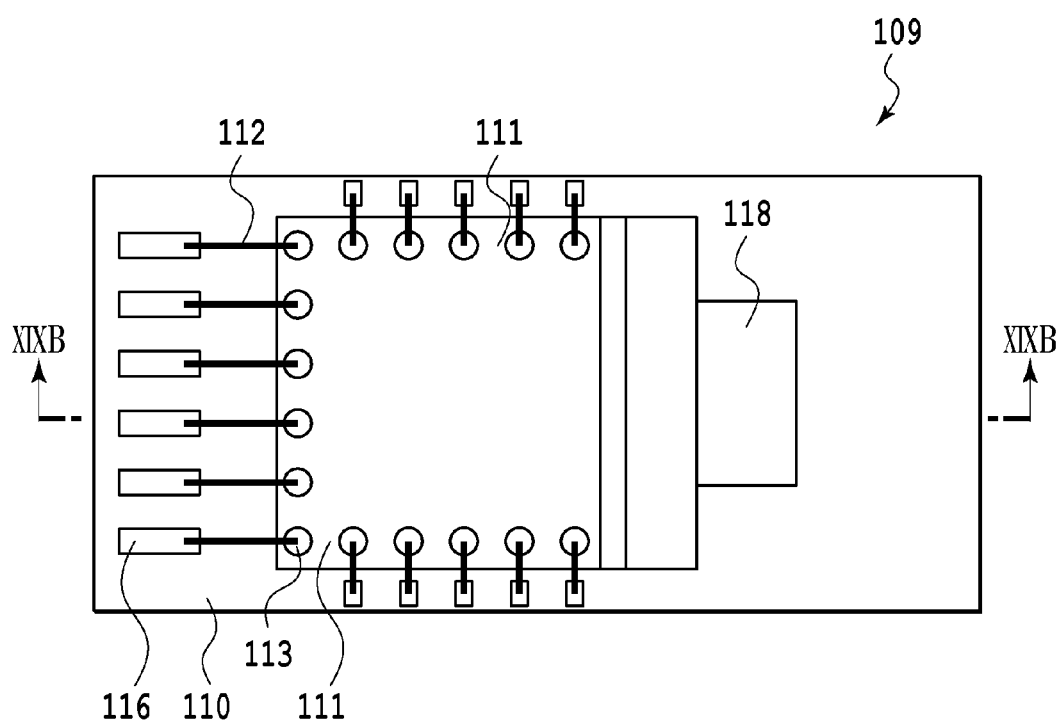
FIG. 19A is a plan view showing a configuration of a module in a twelfth embodiment of the present invention.
Figure 19B:
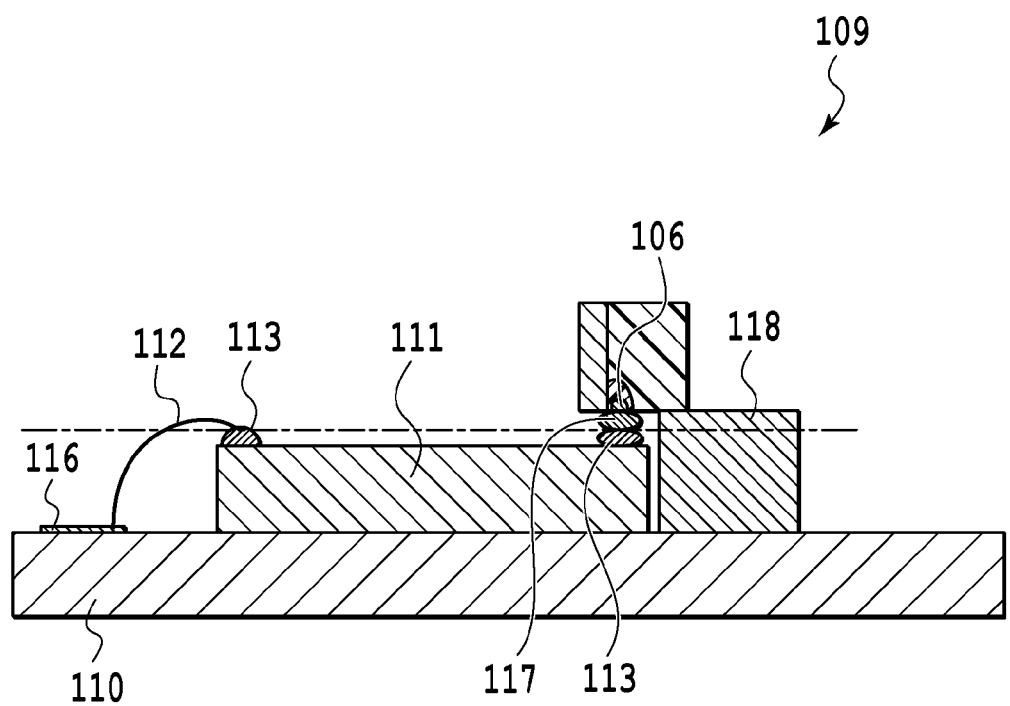
FIG. 19B is a cross-sectional view taken along the cross-section line XIXB-XIXB of FIG. 19A.

FIG. 19A is a plan view showing a configuration of a module of the embodiment, and FIG. 19B is a cross-sectional view taken along the cross-section line XIXB-XIXB of FIG. 19A. As shown in FIGS. 19A and 19B, the module 109 of the embodiment includes a main substrate 110, electrodes 116 on the main substrate 110, an IC 111 on the main substrate 110, a spacer 118 on the main substrate 110, an encapsulated semiconductor element on the spacer 118, gold bumps 113 on the IC 111, and gold bumps 117.

The spacer 118 is installed between the main substrate 110 and the encapsulated semiconductor element, and the module 109 thereby has a space between the IC 111 and the encapsulated semiconductor element. The gold bumps 113 on the IC 111 and the gold bumps 117 are configured to come into contact with one another in the space formed by the spacer 118. The IC 111 and the encapsulated semiconductor element can be electrically connected to each other by this configuration.

In the embodiment described above, although each of the electrical connections between the IC 111 and the encapsulated semiconductor element is achieved by employing a configuration in which two gold bumps are placed in a space formed by the spacer, the number of gold bumps placed in the space formed by the spacer to achieve the electrical connection may be any number of one or more.

Thirteenth Embodiment

Figure 20:
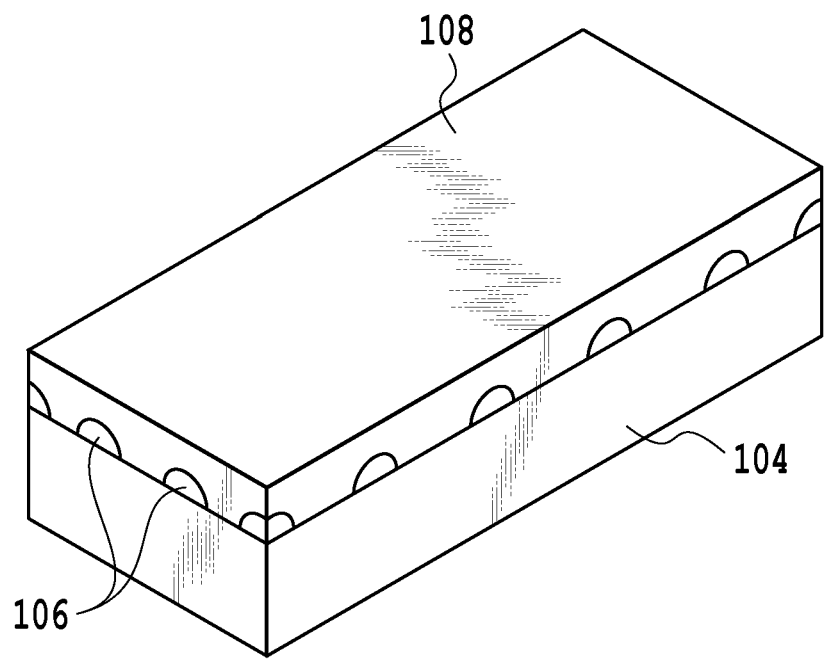
FIG. 20 is a perspective view showing a configuration of an encapsulated semiconductor element in a thirteenth embodiment of the present invention.

FIG. 20 is a perspective view showing a configuration of an encapsulated semiconductor element of the embodiment. As shown in FIG. 20, the encapsulated semiconductor element of the embodiment includes a semiconductor element 104, multiple gold bumps 106 on the semiconductor element 104, and a resin 108 encapsulating the multiple gold bumps 106 on the semiconductor element 104.

Figure 21A:
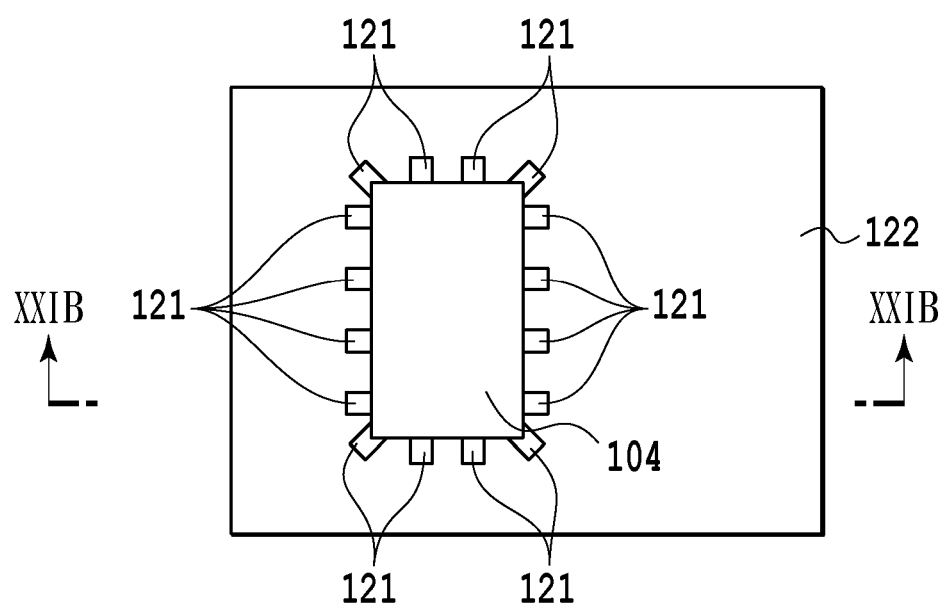
FIG. 21A is a plan view showing a configuration of a module including the encapsulated semiconductor element in the thirteenth embodiment of the present invention.
Figure 21B:
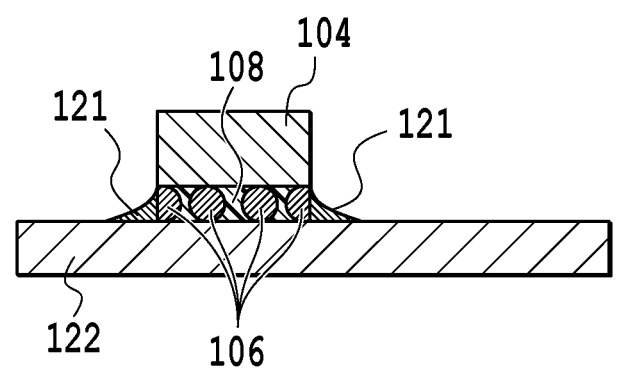
FIG. 21B is a cross-sectional view taken along the cross-section line XXIB-XXIB of FIG. 21A.

FIG. 21A is a plan view of a module including the encapsulated semiconductor element of the embodiment, and FIG. 21B is a cross-sectional view taken along the cross-section line XXIB-XXIB of FIG. 21A. As shown in FIGS. 21A and 21B, the encapsulated semiconductor element of the embodiment can be mounted on a circuit board 122 by using solder 121 like a CSP (Chip Size Package). An electrically-conductive adhesive can be used instead of the solder 121.

Figure 22A:
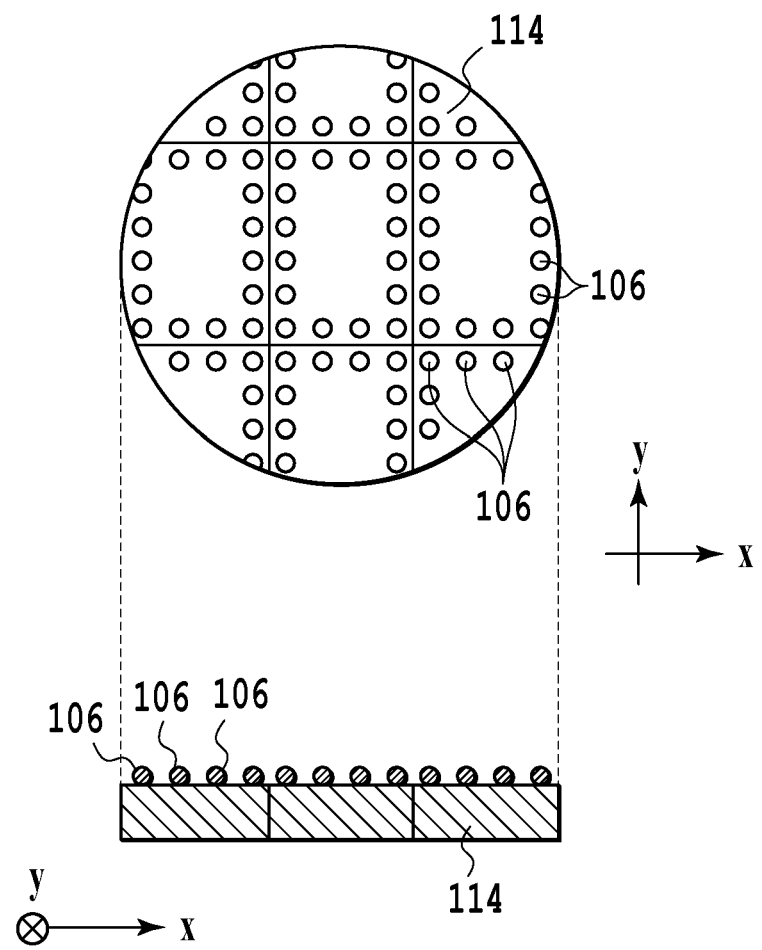
FIG. 22A is a view showing a step of manufacturing the encapsulated semiconductor element in the thirteenth embodiment of the present invention.
Figure 22B:
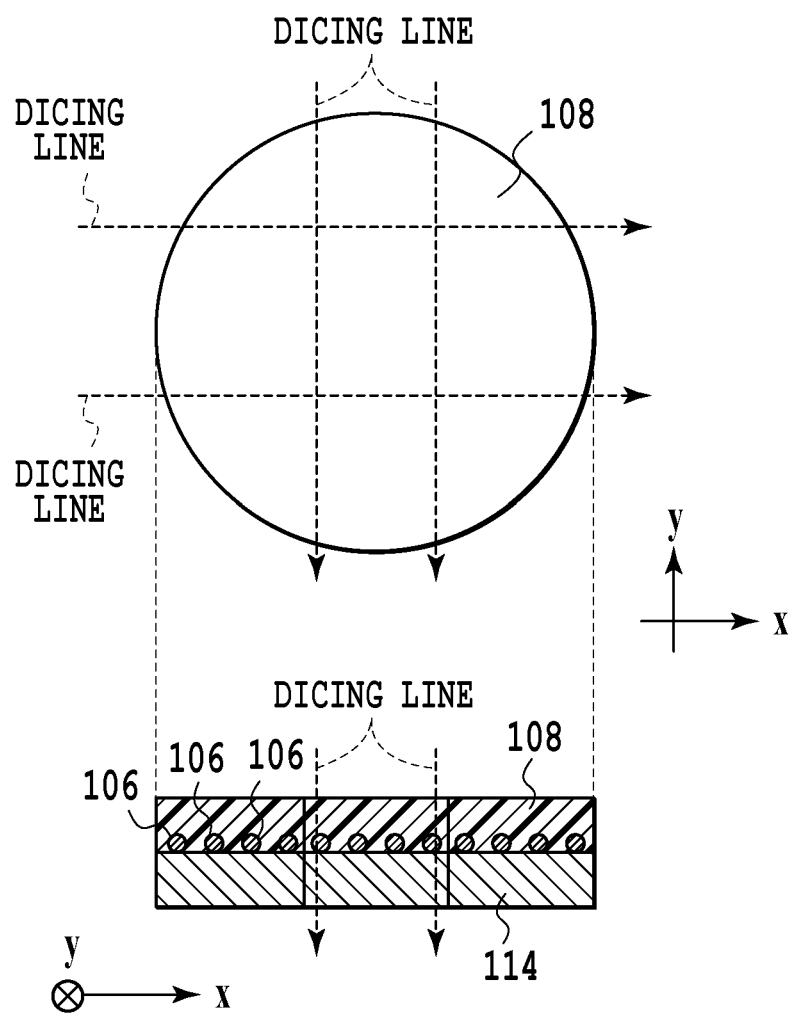
FIG. 22B is a view showing a step of manufacturing the encapsulated semiconductor element in the thirteenth embodiment of the present invention.
Figure 22C:
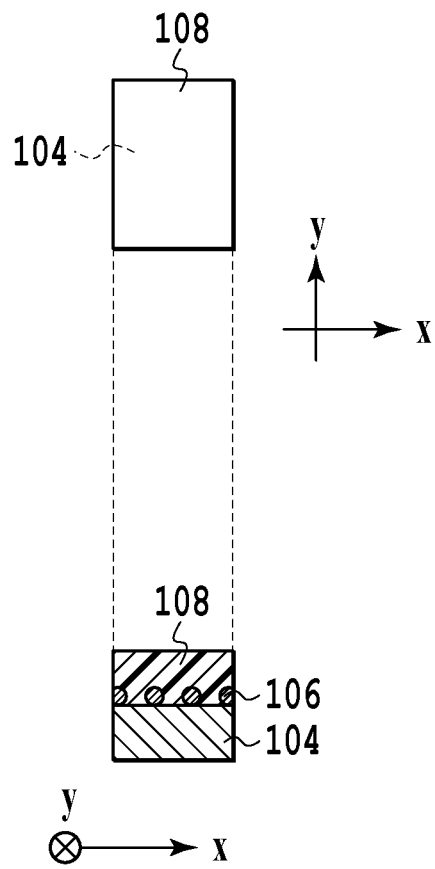
FIG. 22C is a view showing a step of manufacturing the encapsulated semiconductor element in the thirteenth embodiment of the present invention.

FIGS. 22A to 22C show steps of manufacturing the encapsulated semiconductor element of the embodiment.

First, the multiple gold bumps 106 are formed on surface electrodes of a wafer 114 not subjected to dicing (FIG. 22A). As shown in FIG. 22A, the gold bumps 106 are formed to be arranged in straight lines along an x-axis direction and a y-axis direction.

Next, the resin 108 is applied to encapsulate the gold bumps 106 on the wafer 114. The resin 108 is evenly applied to the wafer 114 (FIG. 22B). After the application of the resin 108, the resin is cured by heating, UV curing, or the like.

Lastly, the wafer is diced along dicing lines into individual semiconductor elements 104. Cut surfaces of the gold bumps 106 are exposed by the dicing (FIG. 22C). The exposed surfaces of the gold bumps 106 function as side surface electrodes of the encapsulated semiconductor element. The encapsulated semiconductor element shown in FIG. 22C has 16 side surface electrodes and the 16 side surface electrodes are linearly arranged in the x direction or the y direction.

Fourteenth Embodiment

Figure 23:
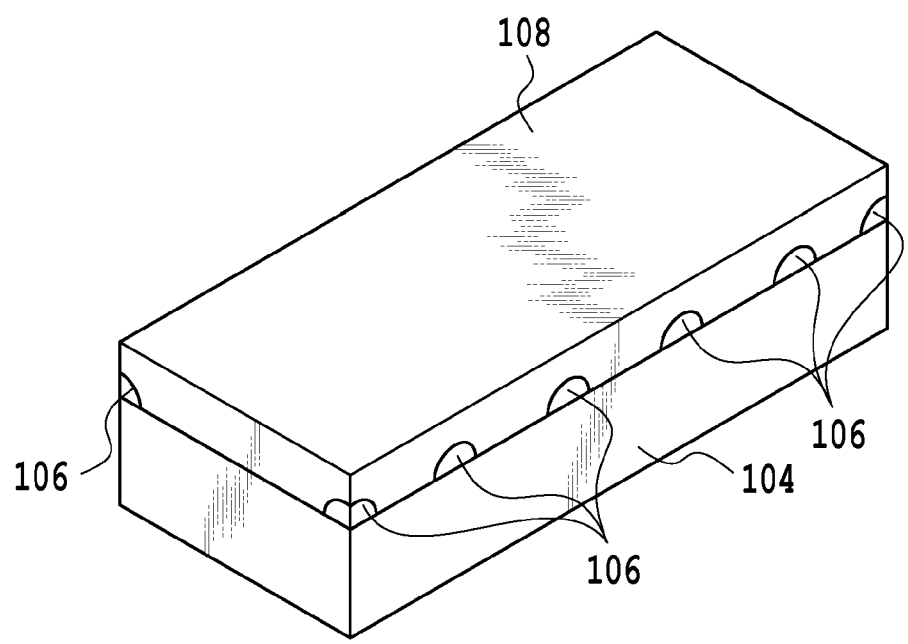
FIG. 23 is a perspective view showing a configuration of an encapsulated semiconductor element in a fourteenth embodiment of the present invention.

FIG. 23 is a perspective view showing a configuration of an encapsulated semiconductor element of the embodiment. As shown in FIG. 23, the encapsulated semiconductor element of the embodiment includes a semiconductor element 104, multiple gold bumps 106 on the semiconductor element 104, and a resin 108 encapsulating the multiple gold bumps 106 on the semiconductor element 104.

Figure 24A:
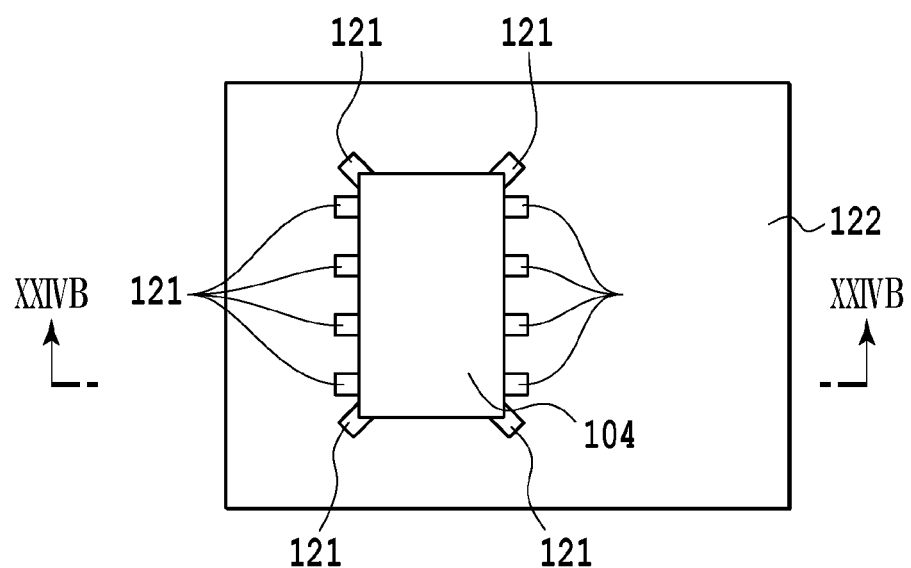
FIG. 24A is a plan view showing a configuration of a module including the encapsulated semiconductor element in the fourteenth embodiment of the present invention.
Figure 24B:
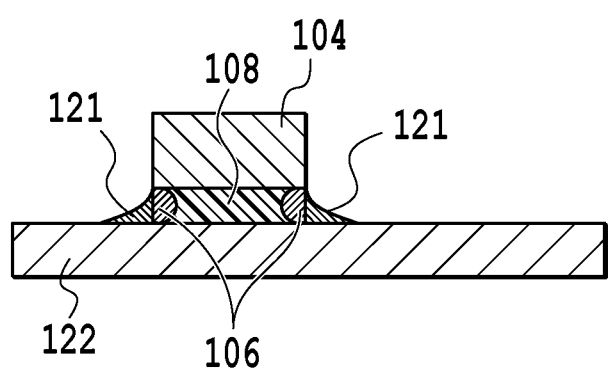
FIG. 24B is a cross-sectional view taken along the cross-section line XXIVB-XXIVB of FIG. 24A.

FIG. 24A is a plan view of a module including the encapsulated semiconductor element of the embodiment, and FIG. 24B is a cross-sectional view taken along the cross-section line XXIVB-XXIVB of FIG. 24A. As shown in FIGS. 24A and 24B, the encapsulated semiconductor element of the embodiment can be mounted on a circuit board 122 by using solder 121 like a CSP (Chip Size Package). An electrically-conductive adhesive can be used instead of the solder.

Moreover, the encapsulated semiconductor element of the embodiment can be mounted on the main substrate in which a step is formed by spot-facing and an element mounting surface has an upper surface and a lower surface. The IC is mounted on the upper surface of the main substrate, and the encapsulated semiconductor element is mounted on the lower surface of the main substrate. One side surface of the encapsulated semiconductor element is fixed to the lower surface of the main substrate by a non-electrically-conductive adhesive, solder, an electrically-conductive adhesive, or the like. The IC and cut surfaces of the gold bumps exposed on another side surface of the encapsulated semiconductor element are connected by wires.

Figure 25A:
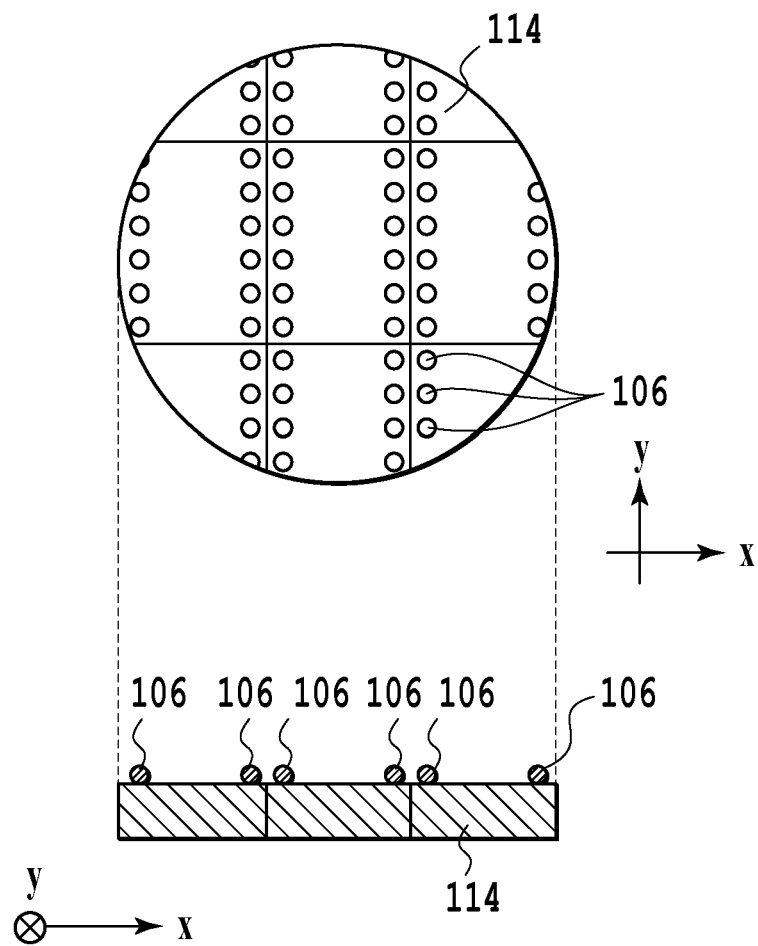
FIG. 25A is a view showing a step of manufacturing the encapsulated semiconductor element in the fourteenth embodiment of the present invention.
Figure 25B:
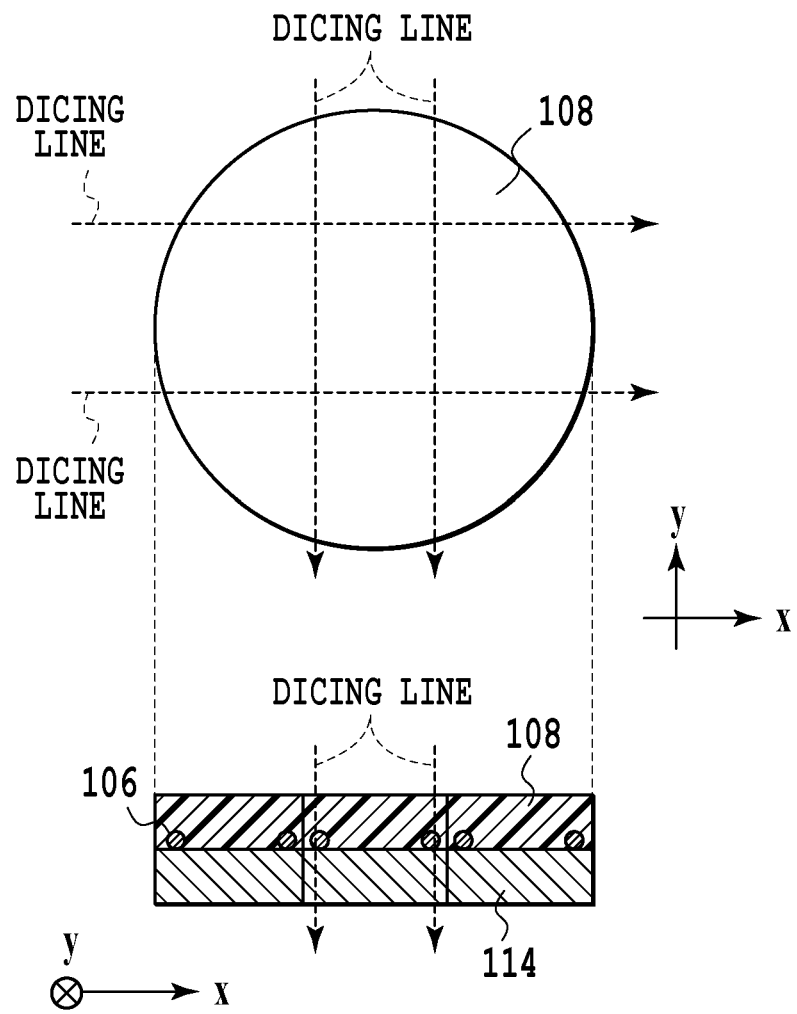
FIG. 25B is a view showing a step of manufacturing the encapsulated semiconductor element in the fourteenth embodiment of the present invention.
Figure 25C:
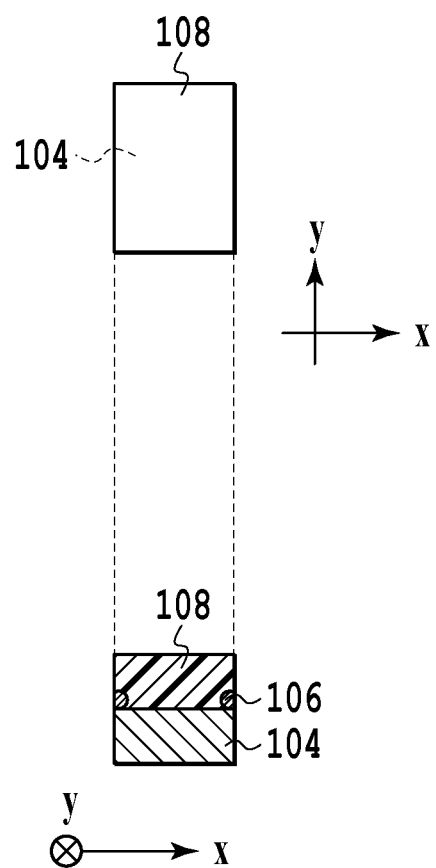
FIG. 25C is a view showing a step of manufacturing the encapsulated semiconductor element in the fourteenth embodiment of the present invention.

FIGS. 25A to 25C are views showing steps of manufacturing the encapsulated semiconductor element of the embodiment.

First, the multiple gold bumps 106 are formed on surface electrodes of a wafer 114 not subjected to dicing (FIG. 25A). As shown in FIG. 25A, the gold bumps 106 are formed to be arranged in straight lines along a y-axis direction.

Next, the resin 108 is applied to encapsulate the gold bumps 106 on the wafer 114. The resin 108 is evenly applied to the wafer 114 (FIG. 25B). After the application of the resin 108, the resin is cured by heating, UV curing, or the like.

Lastly, the wafer 114 is diced along dicing lines into individual semiconductor elements 104. Cut surfaces of the gold bumps 106 are exposed by the dicing (FIG. 25C). The exposed surfaces of the gold bumps 106 function as side surface electrodes of the encapsulated semiconductor element. The encapsulated semiconductor element shown in FIG. 25C has 12 side surface electrodes, and the 12 side surface electrodes are linearly arranged in the y direction.

Fifteenth Embodiment

Figure 28A:
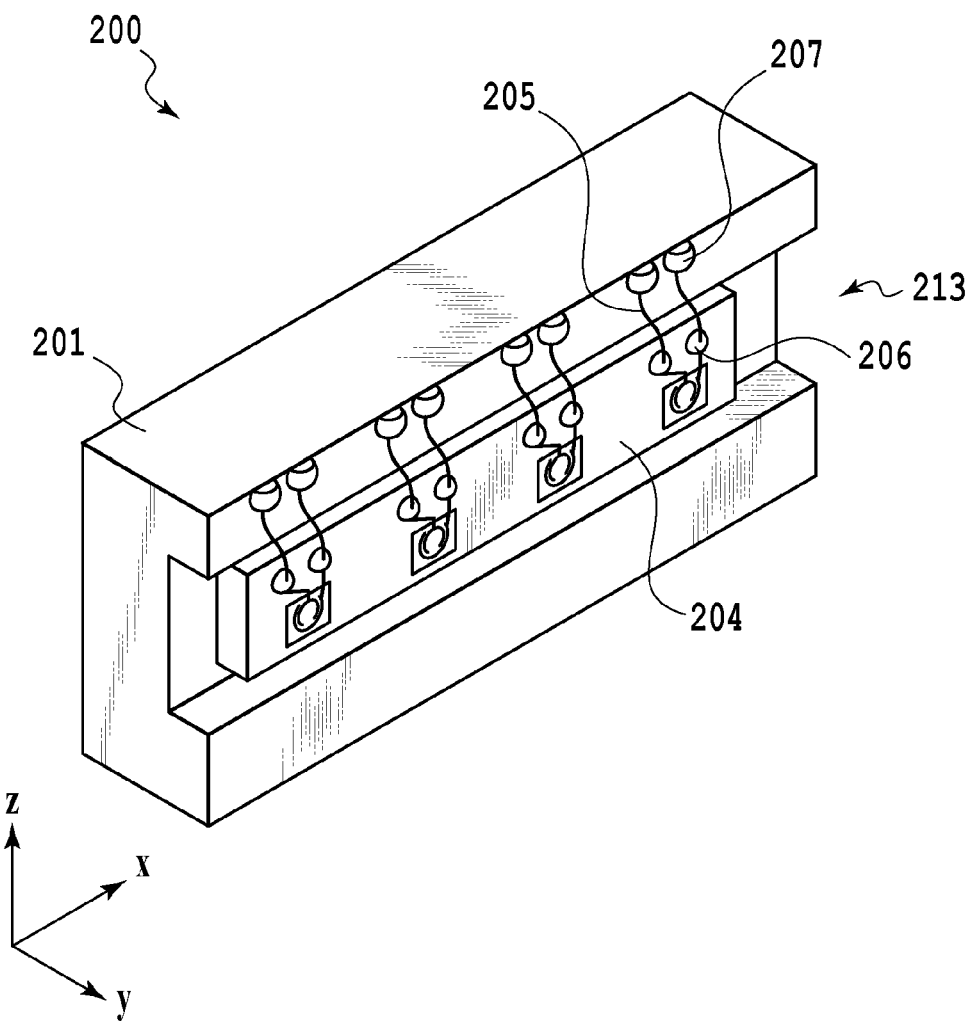
FIG. 28A is a perspective view showing a configuration of a submount in a fifteenth embodiment of the present invention.
Figure 28B:
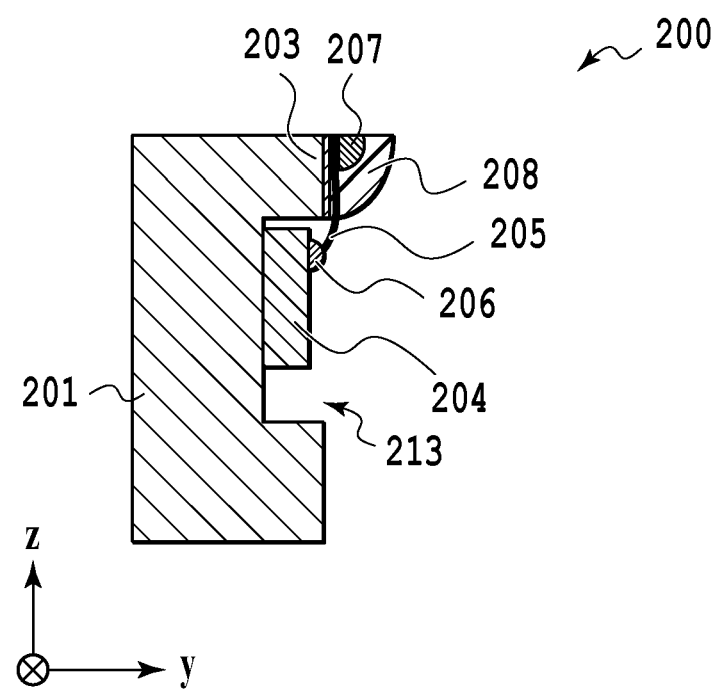
FIG. 28B is a view showing the configuration of the submount in the fifteenth embodiment of the present invention.

FIGS. 28A and 28B are views showing a configuration of a submount of the embodiment. As shown in FIG. 28B, the submount 200 of the embodiment includes a substrate 201, electrodes 203, a semiconductor element 204, Au wires 205, and gold bumps 206 and 207. The submount 200 of the embodiment is different from the submount of [Third Embodiment] of FIG. 9 in that a groove 213 is provided in the substrate 201 and the semiconductor element 204 is mounted in the groove 213. Constitutional elements other than the point that the groove 213 is formed and the point that the semiconductor element 204 is directly mounted on the substrate 201 are the same as those of [Third Embodiment]. Accordingly, description thereof is omitted.

As shown in FIG. 28A, the groove 213 of the embodiment is formed linearly in an arrangement direction of the gold bumps 207 arranged on a surface of the substrate 201 which faces forward in a y-axis direction, i.e. in an X direction of FIG. 28A.

Figure 28C:
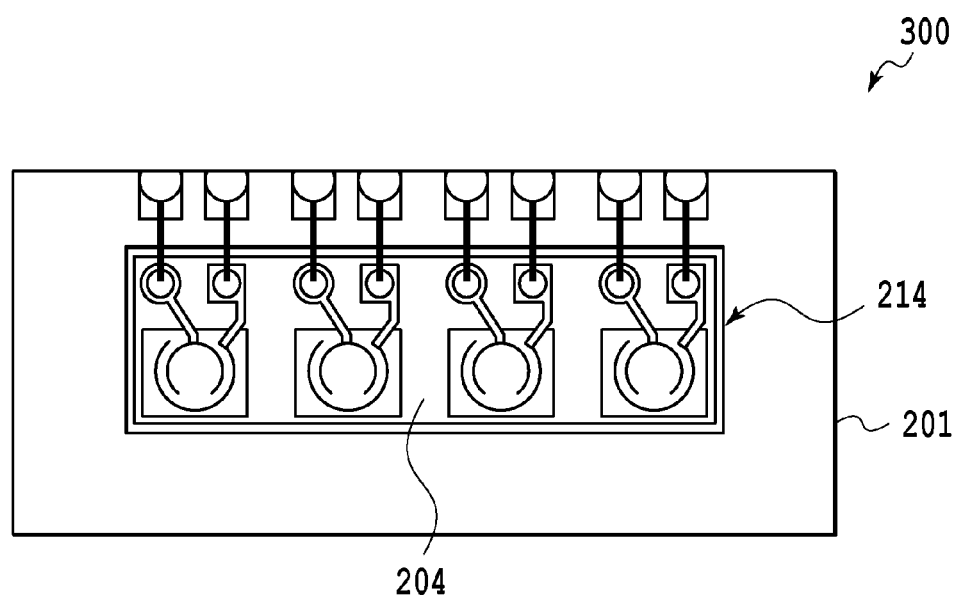
FIG. 28C is a view showing a configuration of another submount in the fifteenth embodiment of the present invention.

FIG. 28C is a view showing a configuration of another submount of the embodiment. As shown in FIG. 28C, in a submount 300 of the embodiment, a rectangular recess-shaped groove 214 having a longitudinal direction that is the same as the longitudinal direction (X direction) of the groove 213 of FIG. 28A is formed on the substrate 201. The semiconductor element 204 is mounted in the recess-shaped groove 214.

Figure 29A:
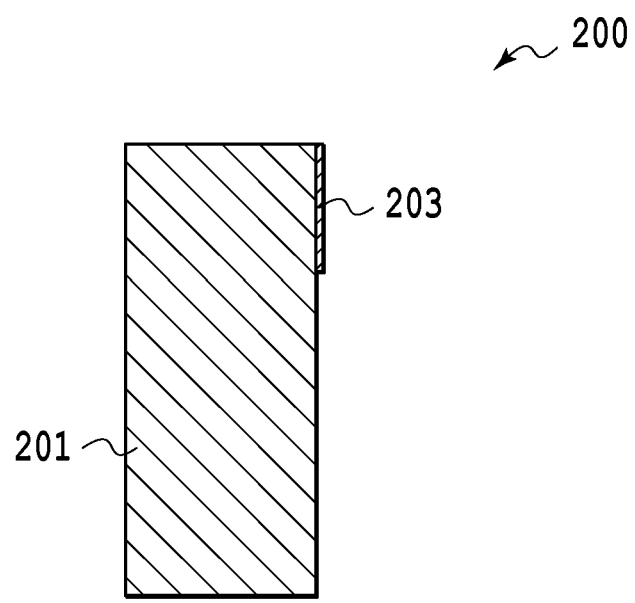
FIG. 29A is a view showing a step of wire bonding in the fifteenth embodiment of the present invention.

FIGS. 29A to 29D are views showing an example of a method of wire bonding in the embodiment. A method of wire bonding in the embodiment is shown below as an example. FIG. 29A shows the substrate 201 before the wire bonding of the embodiment.

Figure 29B:
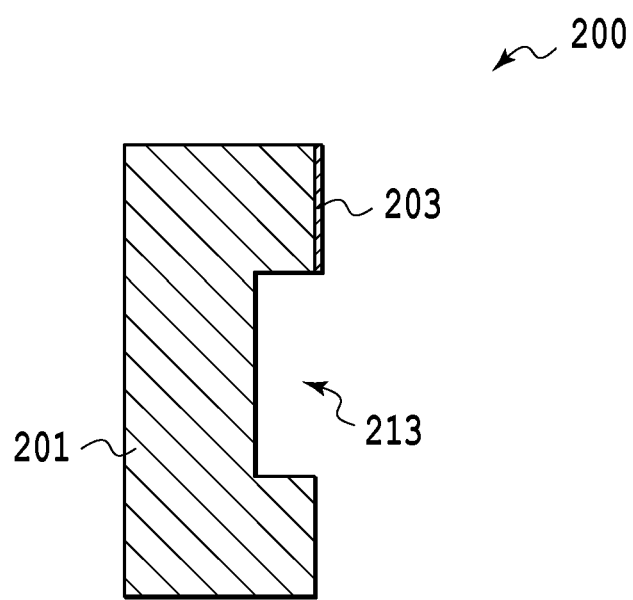
FIG. 29B is a view showing a step of wire bonding in the fifteenth embodiment of the present invention.
Figure 29C:
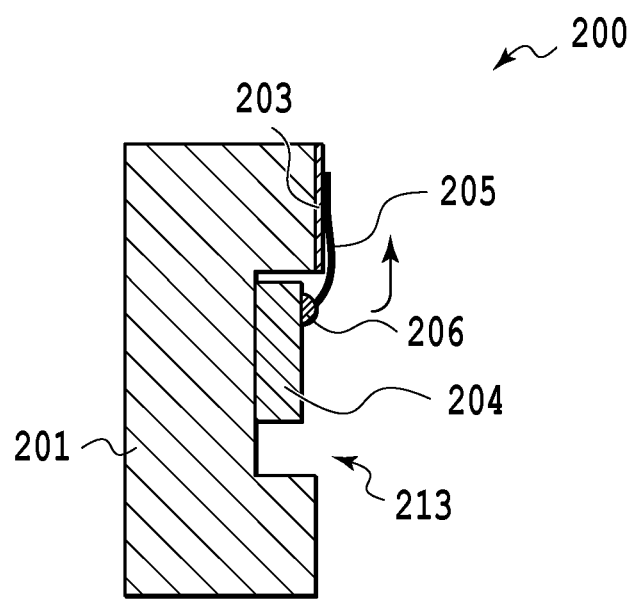
FIG. 29C is a view showing a step of wire bonding in the fifteenth embodiment of the present invention.
Figure 29D:
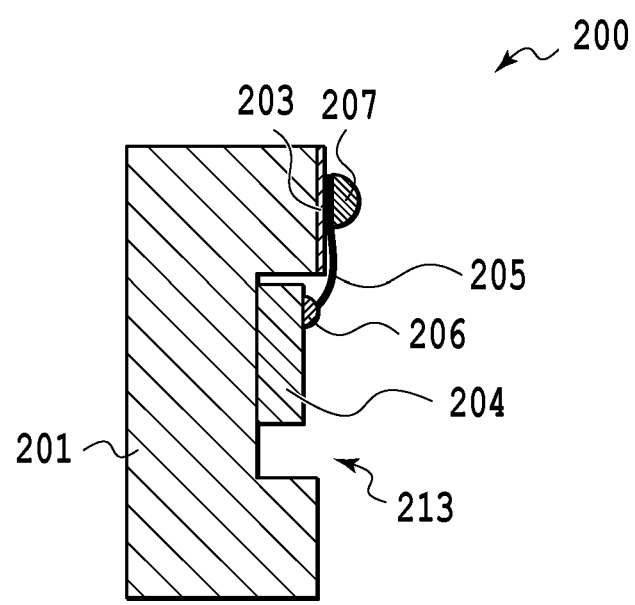
FIG. 29D is a view showing a step of wire bonding in the fifteenth embodiment of the present invention.

In a first step, spot-facing (cutting) is performed on the substrate 201 to form the groove 213 (FIG. 29B). In a second step, the semiconductor element 204 is mounted in the groove 213 (FIG. 29C). In a third step, the gold bumps 206 of the Au wires 205 are formed on pads of the semiconductor element 204 with a ball bonder, and the Au wires 205 are connected from the semiconductor element 204 to the electrodes 203 on the substrate 201 (FIG. 29C). In a fourth step, the gold bumps 207 are formed on the electrodes 203 and the Au wires 205 connected in the third step with the ball bonder (FIG. 29D). The wire bonding can be performed in the steps described above.

The submount 200 of the embodiment is manufactured as follows. First, the gold bumps 207 are formed on the electrodes 203 by the aforementioned wire bonding method in the embodiment. After the gold bumps 207 are formed on the electrodes 203, a resin 208 is applied in such a way that the gold bumps 207 are covered. Then, the applied resin 208 is cured by heating, UV curing, or the like. Thereafter, dicing is performed in such a way that cut surfaces of the gold bumps 207 are exposed. Here, the resin 208 has hardness sufficient to withstand the force of wire bonding. Note that the wire bonding method in the embodiment can be applied to the other embodiments described above.

In the embodiment, as in the third embodiment, the semiconductor element 204 can be prevented from being damaged during resin curing. Moreover, the amount of resin to be applied can be reduced. Note that stress due to resin curing or expansion and shrinkage of the resin caused by temperature fluctuations or the like may damage the semiconductor element.

Furthermore, in the submount 200 of the embodiment, mounting the semiconductor element 204 in the groove 213 on the substrate 201 can reduce the distance between the semiconductor element 204 and the surface of the substrate 201 compared to that in a submount in which no spot-facing portion is formed in the substrate 201. The length of wire bonding is thus reduced and lines of higher speed can be achieved.

Sixteenth Embodiment

Figure 30:
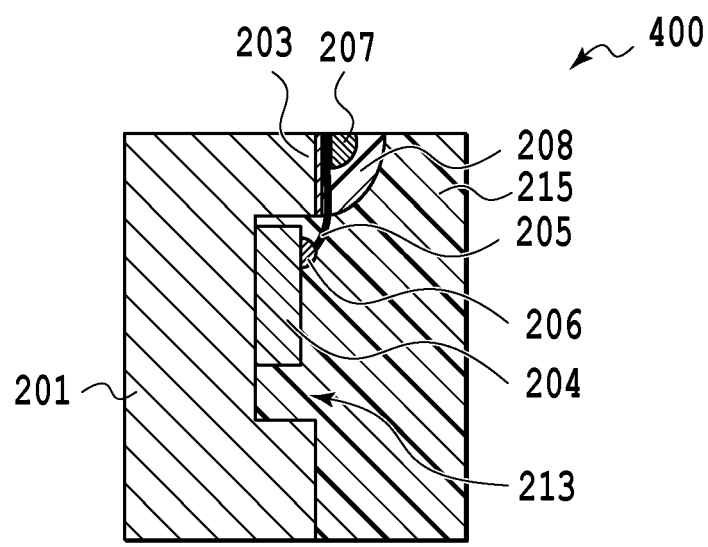
FIG. 30 is a view showing a configuration of a submount in a sixteenth embodiment of the present invention.

FIG. 30 is a view showing a configuration of a submount of the embodiment. As shown in FIG. 30, it is possible to apply a resin 208 in such a way that gold bumps 207 are covered, and then apply another resin 215 on a substrate 201. The submount 300 of the embodiment is different from the submount of [Fifteenth Embodiment] in that the submount 300 further includes the resin 215. Since constitutional elements other than the resin 215 are the same as those of [Fifteenth Embodiment], description thereof is omitted.

The submount 300 of the embodiment is manufactured as follows. First, the gold bumps 207 are formed on electrodes 203 by the wire bonding method of the fifteenth embodiment. After the gold bumps 207 are formed on the electrodes 203, the resin 208 is applied in such a way that the gold bumps 207 are covered. After the application of the resin 208, the resin 215 is applied onto the substrate 201. Then, the applied resin 215 is cured by heating, UV curing, or the like. Thereafter, dicing is performed in such a way that cut surfaces of the gold bumps 207 are exposed. Here, the resin 208 has hardness sufficient to withstand the force of wire bonding, and the resin 215 has hardness lower than that of the resin 208.

If the hardness of the resin is too high, the semiconductor element 204 may be damaged. However, in the embodiment, since the gold bumps 207 are protected by the hard resin 208 while the semiconductor element 204 is protected by the soft resin 215, the semiconductor element 204 can be prevented from being damaged.

A drive IC or an optical element such as a laser diode are examples of the semiconductor element in all of the embodiments described above.

REFERENCE SIGNS LIST 100, 200, 300, 400: submount
101, 201: substrate
102, 103, 116, 203: electrode
104, 204: semiconductor element
105, 112, 205: Au wire
106, 107, 113, 117, 207: gold bump
108, 115, 208, 215: resin
109: module
110: main substrate
111: IC
114: wafer
118: spacer
120: electrical connection
121: solder
122: circuit board
123: bump
213, 214: groove

The invention claimed is:

1. A submount comprises:
   a substrate;
   an electrode on the substrate;
   a semiconductor element on the substrate;
   a wire connecting the semiconductor element and the electrode to each other; and
   one or plurality of first bumps on the electrode and the wire,
   wherein
   the electrode, the semiconductor element, the wire, and the one or plurality of first bumps are encapsulated on the substrate by a resin,
   the one or plurality of first bumps have a cut surface,
   the cut surface is exposed on a surface of the submount, and
   the cut surface is an electrode of the submount.

2. The submount according to claim 1, wherein
   a groove is formed on the substrate, and
   the semiconductor element is mounted in the groove.

3. A module comprises:
a main substrate;
an IC on the main substrate;
the submount according to claim 1 which is provided on the main substrate; and
a wire for wire bonding a second bump on the IC and the first bump included in the submount to each other.

4. A module comprises:
a main substrate;
an IC on the main substrate;
an electrode on the main substrate;
a wire connecting a second bump on the IC and the electrode to each other; and
the submount according to claim 1 which is provided on the electrode on the main substrate,
wherein the exposed cut surface of the first bump of the submount and the electrode on the main substrate are bonded to each other by an electrically-conductive adhesive.

5. A module comprises:
a main substrate;
an IC on the main substrate;
an electrode on the main substrate;
a wire connecting a second bump on the IC and the electrode to each other;
a spacer on the electrode; and
the submount according to claim 1 which is provided on the spacer,
wherein an electrical connection between the second bump on the IC and the first bump included in the submount is achieved by third bumps and the electrode placed in a space formed by the spacer.

6. A module comprises:
a main substrate;
an IC on the main substrate; and
the submount according to claim 1 which is provided on the main substrate,
wherein
the main substrate has an upper surface and a lower surface as element mounting surfaces,
the IC is mounted on the upper surface and the submount is mounted on the lower surface, and
the module further comprises a wire for wire bonding a second bump on the IC and the first bump included in the submount to each other.

7. A module comprises:
a main substrate;
an IC on the main substrate;
a spacer on the IC; and
the submount according to claim 1 which is provided on the spacer,
wherein an electrical connection between a second bump on the IC and the one or plurality of first bumps included in the submount is achieved by one or plurality of third bumps placed in a space formed by the spacer.

8. A module comprises:
a main substrate;
an electrode on the main substrate;
an IC on the electrode;
a spacer on the electrode; and
the submount according to claim 1 which is provided on the spacer,
wherein an electrical connection between a second bump on the IC and the first bump included in the submount is achieved by third bumps and the electrode placed in a space formed by the spacer.

9. A submount comprises:
a substrate;
an electrode on the substrate;
a semiconductor element on the substrate;
a wire connecting the semiconductor element and the electrode to each other; and
a first bump on the electrode and the wire,
wherein
the first bump is encapsulated by a first resin which is locally applied on the substrate,
the first bump has an exposed cut surface, and
the exposed cut surface is an electrode of the submount.

10. The submount according to claim 9, the submount further comprises:
a second resin encapsulating the electrode, the semiconductor element, the wire, the first bump, and the first resin, and
the first resin is harder than the second resin.

11. The submount according to claim 9, wherein
a groove is formed on the substrate, and
the semiconductor element is mounted in the groove.

12. A module comprises:
a main substrate;
an IC on the main substrate;
the submount according to claim 9 which is provided on the main substrate; and
a wire for wire bonding a second bump on the IC and the first bump included in the submount to each other.

13. A module comprises:
a main substrate;
an IC on the main substrate;
an electrode on the main substrate;
a wire connecting a second bump on the IC and the electrode to each other; and
the submount according to claim 9 which is provided on the electrode on the main substrate,
wherein the exposed cut surface of the first bump of the submount and the electrode on the main substrate are bonded to each other by an electrically-conductive adhesive.

14. A module comprises:
a main substrate;
an IC on the main substrate;
an electrode on the main substrate;
a wire connecting a second bump on the IC and the electrode to each other;
a spacer on the electrode; and
the submount according to claim 9 which is provided on the spacer,
wherein an electrical connection between the second bump on the IC and the first bump included in the submount is achieved by third bumps and the electrode placed in a space formed by the spacer.

15. A module comprises:
a main substrate;
an IC on the main substrate; and
the submount according to claim 9 which is provided on the main substrate,
wherein
the main substrate has an upper surface and a lower surface as element mounting surfaces,
the IC is mounted on the upper surface and the submount is mounted on the lower surface, and
the module further comprises a wire for wire bonding a second bump on the IC and the first bump included in the submount to each other.

16. A module comprises:
a main substrate;
an IC on the main substrate;
a spacer on the IC; and
the submount according to claim 9 which is provided on the spacer,
wherein an electrical connection between a second bump on the IC and the first bump included in the submount is achieved by one or plurality of third bumps placed in a space formed by the spacer.

17. A module comprises:
a main substrate;
an electrode on the main substrate;
an IC on the electrode;
a spacer on the electrode; and
the submount according to claim 9 which is provided on the spacer,
wherein an electrical connection between a second bump on the IC and the first bump included in the submount is achieved by third bumps and the electrode placed in a space formed by the spacer.

18. A module comprises:
a main substrate;
an IC on the main substrate; and
an encapsulated semiconductor element on the main substrate,
wherein
the main substrate has an upper surface and a lower surface as element mounting surfaces,
the IC is mounted on the upper surface and the encapsulated semiconductor element is mounted on the lower surface, and
the module further comprises a wire for wire bonding a second bump on the IC and the first bump included in the encapsulated semiconductor element to each other; and
the encapsulated semiconductor element comprises:
a semiconductor element; and
a first bump on the semiconductor element, wherein
the first bump is encapsulated on the semiconductor element by a resin,
the first bump has an exposed cut surface, and
the exposed cut surface is an electrode of the encapsulated semiconductor element.

19. The module according to claim 18, wherein the first bump is encapsulated by a first resin applied only to a portion around the first bump on the semiconductor element.

20. The module according to claim 19, wherein
the encapsulated semiconductor element further comprises a second resin encapsulating the semiconductor element, the first bump, and the first resin, and
the first resin is harder than the second resin.

* * * * *